(12) United States Patent
Kinzel et al.

(10) Patent No.: US 10,989,867 B2
(45) Date of Patent: Apr. 27, 2021

(54) MICROSPHERE BASED PATTERNING OF METAL OPTIC/PLASMONIC SENSORS INCLUDING FIBER BASED SENSORS

(71) Applicant: The Curators of the University of Missouri, Columbia, MO (US)

(72) Inventors: Edward C. Kinzel, Columbia, MO (US); Mahmoud Almasri, Columbia, MO (US); Chuang Qu, Columbia, MO (US); Ibrahem Jasim, Columbia, MO (US); Jiayu Liu, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

(21) Appl. No.: 16/849,908

(22) Filed: Apr. 15, 2020

(65) Prior Publication Data

US 2020/0326475 A1    Oct. 15, 2020

Related U.S. Application Data

(60) Provisional application No. 62/834,149, filed on Apr. 15, 2019.

(51) Int. Cl.
*G02B 6/036* (2006.01)
*G02B 6/02* (2006.01)
*G03F 7/00* (2006.01)

(52) U.S. Cl.
CPC ..... *G02B 6/02395* (2013.01); *G02B 6/02123* (2013.01); *G02B 6/036* (2013.01); *G03F 7/0005* (2013.01)

(58) Field of Classification Search
CPC ................ G02B 6/02395; G02B 6/036; G02B 6/02123; G03F 7/0005
See application file for complete search history.

(56) References Cited

U.S. PATENT DOCUMENTS 10,725,373 B1 *   7/2020   Kumar ................. G03F 7/0002
2015/0272903 A1 * 10/2015   Amsden ................ B82Y 40/00
                                                                424/443

OTHER PUBLICATIONS

Antohe et al., "Nanoscale Patterning of Gold-Coated Optical Fibers for Improved Plasmonic Sensing", Nanotechnology, 2017, pp. 1-8, vol. 28, IOP Publishing Ltd.
Pisco et al., "Nanosphere Lithography for Optical Fiber Tip Nanoprobes", Light: Science & Applications, 2017, pp. 1-12, vol. 6.
Qu et al., "Infrared Metasurfaces Created with Off-Normal Incidence Microsphere Photolithography", Optics Express, May 2017, vol. 25, No. 11.
Qu et al., "Mask-Based Microsphere Photolithography", Manufacturing Science and Engineering Conference, Jun. 2018, pp. 1-5.

(Continued)

*Primary Examiner* — Ellen E Kim
(74) *Attorney, Agent, or Firm* — Thompson Coburn LLP; Steven M. Ritchey

(57) ABSTRACT

A fiber-based sensor and a method of forming a fiber-based sensor using microsphere lithography techniques in which a microsphere array is applied to a surface of a tip of an optical fiber to provide for microsphere lithography fabrication of a desired pattern on the tip of the optical fiber. The characteristics of the pattern define sensing capabilities of the sensor to provide for chemical and/or biological sensing.

15 Claims, 45 Drawing Sheets

(56) References Cited

OTHER PUBLICATIONS

Wu et al., "Fabrication of Large Area Periodic Nanostructures Using Nanosphere Photolithography", Nanoscale Research Letters, Jul. 2008, pp. 351-354, vol. 3.
Aernecke et al., "Optical-Fiber Arrays for Vapor Sensing", Sensors Actuators B Chem, 2009, pp. 464-469, vol. 142.
Bonakdar et al., "Novel High-Throughput and Maskless Photolithography to Fabricate Plasmonic Molecules", Journal of Vacuum Science & Technology B, 2014, vol. 32, No. 2.
Bonakdar et al., "High-Throughput Realization of an Infrared Selective Absorber/Emitter by DUV Microsphere Projection Lithography", Nanotechnology, 2016, pp. 1-6, vol. 27.
Culshaw, "Optical Fiber Sensor Technologies: Opportunities and-Perhaps-Pitfalls", Journal of Lightwave Technology, Jan. 2004, pp. 39-50, vol. 22, No. 1.
Guo et al., "Near-Field Laser Parallel Nanofabrication of Arbitrary-Shaped Patterns", Applied Physics Letters, 2007, 4 pgs., vol. 90.
Ho et al., "Phase-Sensitive Surface Plasmon Resonance Biosensor Using the Photoelastic Modulation Technique", Sensors Actuators B Chem, 2006, pp. 80-84, vol. 114.
Kuenzi et al., "Automated Characterization of Dextran/Concanavalin A Mixtures—A Study of Sensitivity and Temperature Dependence at Low Viscosity as Basis for an Implantable Glucose Sensor", Sensors Actuators B Chem, 2010, pp. 1-7, vol. 146.
Lan et al., "Reflection Based Extraordinary Optical Transmission Fiber Optic Probe for Refractive Index Sensing", Sensors Actuators B Chem, Mar. 2014, pp. 95-99, vol. 193.
Malara et al., "Resonant Enhancement of Plasmonic Nanostructured Fiber Optic Sensors", Sensors Actuators B Chem, 2018, pp. 1587-1592, vol. 273.
Martin-Moreno et al., "Theory of Extraordinary Optical Transmission through Subwavelength Hole Arrays", Physical Review Letters, Feb. 2001, pp. 1114-1117, vol. 86, No. 6.
Pickup et al., "Fluorescence-Based Glucose Sensors", Biosensors and Bioelectronics, 2005, pp. 2555-2565, vol. 20.
Qu et al., "Thermal Radiation from Microsphere Photolithography Patterned Metasurfaces", American Society of Mechanical Engineers, Jul. 2017, pp. 1-4.
Sanders et al., "An Enhanced LSPR Fiber-Optic Nanoprobe for Ultrasensitive Detection of Protein Biomarkers", Biosensors and Bioelectronics, 2014, pp. 95-101, vol. 61.
Shrivastav et al., "Fiber Optic SPR Sensor for the Detection of Melamine Using Molecular Imprinting", Sensors Actuators B Chem, 2015, pp. 404-410, vol. 212.
Siegel et al., "Hard and Soft Micro- and Nanofabrication: An Integrated Approach to Hydrogel Based Biosensing and Drug Delivery", Journal of Controlled Release, Feb. 2010, pp. 303-313, vol. 141, No. 3.
Szunerits et al., "Recent Advances in the Development of Graphene-Based Surface Plasmon Resonance (SPR) Interfaces", Analytical and Bioanalytical Chemistry, 2013, pp. 1435-1443, vol. 405.
Tam et al., "DNA Detection on Ultrahigh-Density Optical Fiber-Based Nanoarrays", Biosensors and Bioelectronics, 2009, pp. 2488-2493, vol. 24.
Wang et al., "Fiber-Optic Chemical Sensors and Biosensors (2008-2012)", Analytical Chemistry, 2013, pp. 487-508, vol. 85.
Zhang et al., "Enhanced Optical Power of GaN-Based Light-Emitting Diode with Compound Photonic Crystals by Multiple-Exposure Nanosphere-Lens Lithography", Applied Physics Letters, 2014, 4 pgs., vol. 105.

\* cited by examiner

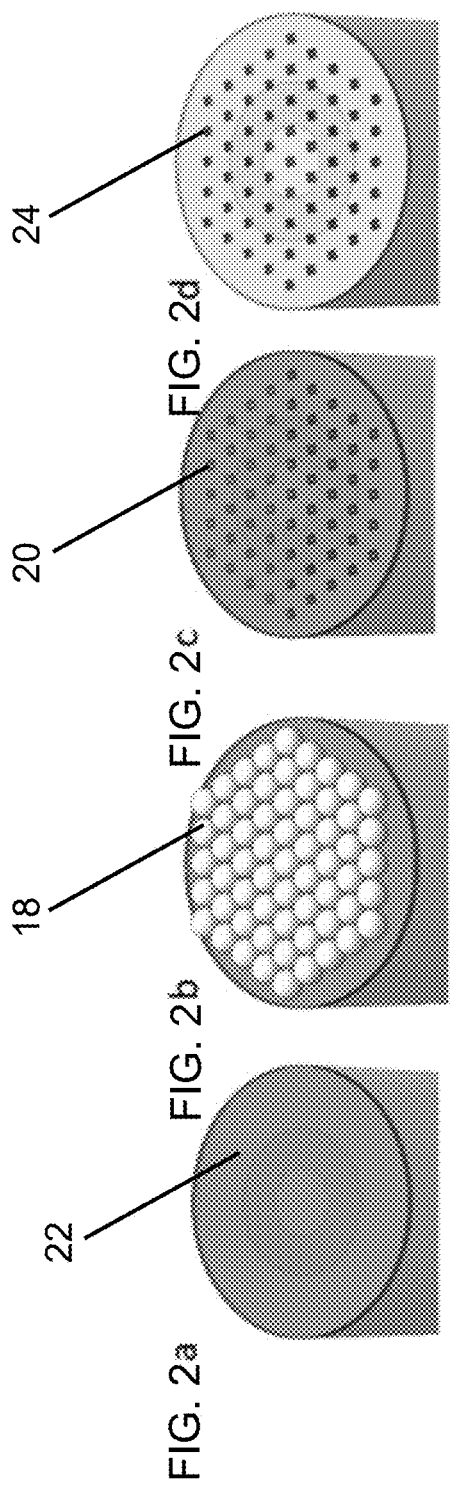

$$t_{if} = \sum_{\alpha,\beta,\gamma} \tau_{i\alpha}^{12} e_\alpha (\delta_{\alpha\beta} - \rho_{\alpha\gamma}^R e_\gamma \rho_{\gamma\beta}^L e_\beta)^{-1} \tau_{\beta f}^{23}$$

FIG. 9a $$E_{dose} = I_{int} \times t_{dose}$$

FIG. 9b $$\frac{I_{pr}(x,y,z)}{I_{int}(x,y,z)} = \left(\frac{E_{pr}(x,y,z)}{E_{int}(x,y,z)}\right)^2$$

FIG. 9c

MICROSPHERE BASED PATTERNING OF METAL OPTIC/PLASMONIC SENSORS INCLUDING FIBER BASED SENSORS

CROSS-REFERENCE TO RELATED APPLICATIONS

This application claims priority to U.S. provisional patent application No. 62/834,149, filed Apr. 15, 2019, which is incorporated herein by reference in its entirety.

STATEMENT REGARDING FEDERALLY SPONSORED RESEARCH OR DEVELOPMENT

Not Applicable.

APPENDIX

Not Applicable.

BACKGROUND

Small scale sensors have been widely used in many applications due to their wide range of applicability, including physical, medical, chemical and biological sensing. For example, there are many biochemical applications that require inexpensive, minimally intrusive sensors, such as continuous blood glucose monitoring, pH identification, humidity measurement and liquid identification. These small scale sensors can be built in micro/nano scale, and nanoscale phenomenon can be utilized to provide particularized sensing capabilities.

Optical refractive index (RI) sensing can be used in chemistry and biology for label-free detection. Both metal-based plasmonic and dielectric-based optical designs produce a resonant frequency that depends on the refractive index of an analyte. The performance of these sensors is characterized by their sensitivity (S), where $S = \Delta\lambda_0/\Delta n$, which describes the shift of the resonant wavelength with respect to the change in the refractive index of the analyte. The ability to resolve the resonant wavelength is also affected by its full width at half maximum (FWHM), and a known figure of merit (FOM) for RI sensors is FOM=S/FWHM. Propagating surface plasmon resonance (PSPR) sensors have sensitivities as high as $2\times10^6$ nm/RIU (refractive index unit) due to the large penetration depth of the evanescent field into the dielectric medium. However, this comes at the expense of a relatively large interrogation volume.

Local surface plasmon resonance (LSPR) sensors have lower sensitivity but a confined interrogation volume which provides a greater spatial resolution of the analyte. In an LSPR based sensor, high charge density oscillations interact with the surrounding environment. The generated evanescent field is sensitive to small changes of the refractive index of the surrounding medium. The feature sizes required for LSPR based sensors dictates the use of nano patterning techniques. The theoretical limit for the sensitivity of LSPR sensors is proportional to the ratio between the resonant wavelength and index of refraction, $\lambda_0/n$. Sensitivities of 1000 nm/RIU are typical and can be further improved by introducing Fano resonances with dark modes.

For example, a small scale sensor according to the above may be fabricated with a structural feature created by (e.g., direct-write) fabrication techniques such as Focused Ion Beam (FIB), Electron Beam Lithography (EBL), nanosphere lithography (NSL), and nanoimprint lithography. However, direct-write techniques such as FIB and EBL are slow and costly, and are not well-suited for large-scale fabrication/production of sensors. These direct-write techniques are instead better suited for one-off scenarios such as prototyping and academic studies. These techniques are also not very versatile to tune the geometry of individual nanostructures. Diffraction limits the ability to pattern certain sensors using conventional lithography techniques because of the nanoscale dimensions. Additionally, conventional lithography techniques have limited applicability at nanoscale dimensions. For NSL, as the nanospheres cannot be recollected in the NSL process, it is unlikely to be used for large-scale nanomanufacturing problems. Nanoimprint lithography also has issues, as it often involves a template transfer technique using a transparent curing adhesion layer, and the pressure applied during nanoscale mask alignment could, in the case of an optical fiber-type sensor, result in bulging of the fiber tip and misalignment due to the small area of the fiber core.

In view of the drawbacks of the techniques discussed above, there is a need for a versatile, low-cost fabrication method for large-scale production of small scale sensors.

SUMMARY OF THE INVENTION

This section provides a general summary of the disclosure, and is not a comprehensive disclosure of its full scope or all of its features.

The present application relates to a sensor and a method of making a sensor using microsphere lithography (MPL) techniques. Due to increased needs of identification of fluids, gases, agents and other materials via sensors, it is important to have cheap, reusable sensors available for such detection applications. MPL is an attractive method to fabricate such sensors, as MPL facilitates fabrication of nanopatterns on large areas (e.g., thereby forming a metasurface). The parameters of these nanopatterns can be defined to provide particularized sensing. In MPL, microspheres are used as microlenses to focus (e.g., ultraviolet aka UV) light into a photoresist film underneath the microspheres in order to produce arbitrary patterns or to focus on a material that can be patterned by various other patterning techniques (e.g., laser ablation, etching, etc.). The microspheres are grouped as an array (e.g., a self-assembled microsphere lattice) to be applied to the photoresist layer. Once applied to the photoresist layer, the microspheres are exposed to radiation from a radiation source. The focal spot of microspheres has a jet-like shape (e.g., a photonic jet, serving as a near-field focusing effect), where an elongated beam forms immediately beneath the microsphere.

Further, chemically synthesized microspheres do not require any microfabrication process, resulting in a lower cost and a greater availability of materials. In addition, the size of microspheres are available in a wide range of diameters (e.g., from ~10 nm to several 100 μm) with a standard deviation of less than 2%. These properties also serve to make microsphere lenses valuable as they are compatible with a variety of optoelectronic and sensing applications.

In order to take advantage of such microsphere properties in optoelectronic and/or sensor applications, and to utilize the capabilities presented by MPL, it is beneficial to achieve feature sizes below ~100 nm, particularly to access resonant responses in the near infrared (IR) and visible regions of the light spectrum. Optical fiber provides an ideal platform for LSPR RI sensors because the advantage of local interrogation is integrated with illumination/collection. This facilitates greater flexibility, remote sensing, and light weight compared to free-space coupling options. These attributes are particularly useful for microfluidics and in-vivo access. RI sensors can be patterned either on the sidewall of optical fiber, fiber tip or both for transmission/reflection measurements. For sensors formed on the tip of the optical fiber, reflection-based measurements only require one port into the sensing media, and the interrogation area can approach the area of the fiber core (e.g., as small as $\frac{1}{2500}$ mm$^2$ for single mode fiber).

For the patterning of an RI sensor on the fiber tip, MPL is capable of fabrication of structures featured with highly ordered periodic structures in 2D. A self-assembled microsphere array is used as an optical element and focuses UV flood illumination to sub-diffraction limited photonic nano-jets within the photoresist. This near-field effect is desirable to create micro and sub-micro scaled features. Combined with positive/negative tone photoresist and etching/lift-off techniques, this method is capable of fabricating nanopillar/hole arrays that meet the requirements of RI sensors. Compared to conventional techniques described above, MPL utilizes microsphere as an optical element instead of physical vapor deposition (PVD) or etching masks, not only reducing the consumption of microsphere but also offering some versatility for fabrication.

The present MPL technique described herein allows a microsphere array to be applied to a surface of a material used in a sensor, enabling formation of metasurface features on the surface. Radiating the microspheres forms a pattern corresponding to the microsphere arrangement in a (photoresist) layer located below the microspheres, which then provides for fabrication of nano features on the surface. These nano features may comprise a hole array in a metal (e.g., aluminum or gold) film on the tip of the end-facet of single mode fiber (SMF), or a post/pillar array in the metal film. These nano features are tuned to sense the medium desired to be sensed. The small numerical aperture in SMF allows the reflectance spectrum to be modeled using plane wave excitation. The diameter of the holes depends on the exposure dose. This is significant because the resonant wavelength of the sensor depends on the hole diameter. Numerical simulation of infinite arrays is used to understand the effects of the geometrical parameters defining the nano-hole array. These results indicate that a guided mode has higher RI sensitivity than an EOT (Extraordinary Transmission) mode, even over an infinite array.

In the present MPL approach described herein, microspheres (e.g., silica or polystyrene microspheres) are self-assembled to form a Hexagonal Close-Packed (HCP) array on top of a layer of a photoresist. The microspheres serve as an optical element and focus radiation (e.g., collimated UV radiation) to an array of photonic jets inside the photoresist layer. The exposed region is dependent on the angle of incidence of the UV radiation which facilitates hierarchical patterning. Pattern transfer can be accomplished using either etching or lift-off with the size of the features being dependent on the exposure dose of the radiation.

Because MPL is a low-cost and very scalable fabrication technique that influences the design and performance of the sensor in several ways, it is well-suited to the production of finely-tuned sensors. In the case where the sensor comprises an optical fiber, one fabrication method includes patterning an entire cleaved face of the fiber without alignment to the fiber core. While any defects present in the self-assembled microsphere lattice may be transferred to the surface, these defects do not result in a significant detrimental performance.

One preferred embodiment includes fabrication of an optical fiber type sensor, utilizing MPL techniques to produce a low-cost fabrication of a fiber-optic based sensor. Due to their small sizes, flexibility, extreme light weight, immunity to electromagnetic interference, remote sensing ability and high sensitivity, optical fiber sensors are particularly attractive for use in a wide spectrum of sensing applications, including the aforementioned biological and chemical applications (e.g., gas sensing).

A sensor of one embodiment of the present application includes a thin metal (e.g., aluminum) film on a surface (e.g., a cleaved face) of an (e.g., single mode) optical fiber, perforated with an HCP hole-array. Patterned metal holes provide an efficient sensing mechanism because of the dependence of resonance wavelength of the EOT on the surrounding medium refractive index. The sensing is based on the change of the effective index at the interface of the metal to the surrounding environment which produces a wavelength shift depending on the RI of the ambient medium. At resonance, EOT decreases the reflection from the fiber tip. The conditions for resonance are dependent on the local environment surrounding the fiber tip and the resonant wavelength can be used to measure the index of refraction of a liquid, for example. Thus, viable sensors can be realized with MPL fabrication techniques, with improvements including smaller, more sensitive and cheaper sensors, with expanded flexibility and high-throughput fabrication.

An alternative embodiment utilizes MPL to create posts/pillars (e.g., instead of holes). In either embodiment, the microspheres may be applied to the desired surface by way of a direct water surface application technique, or a mask technique in which the microspheres are transferred to the intended surface by way of a tape comprising microspheres located thereon, such that pressing of the tape against the desired surface transfers the microspheres from the tape to the desired surface.

These are merely some of the innumerable aspects of the present invention and should not be deemed an all-inclusive listing of the innumerable aspects associated with the present invention. These and other aspects will become apparent to those skilled in the art in light of the following disclosure and accompanying drawings. The description and specific examples in this summary are intended for purposes of illustration only and are not intended to limit the scope of the present disclosure.

One embodiment of the present invention is directed to a method of forming a network array of nanoantennas on an optical fiber, wherein the optical fiber comprises a glass fiber and an encapsulation of the glass fiber, wherein the glass fiber comprises a core and a cladding, the method comprising:

conducting microsphere photolithography on an optical fiber assembly, wherein the optical fiber assembly comprises:
an exposed area of the glass fiber that is an end surface of the glass fiber and/or a portion of the circumferential surface of the glass fiber from which a portion of the encapsulation has been removed from the optical fiber;
an optional sub-photoresist layer on the exposed area of the glass fiber, wherein the optional sub-photoresist layer has a thickness in a range of about 25 nm to about 150 nm, wherein the sub-photoresist layer comprises a metal, dielectric, semiconductor, or combination thereof;

a photoresist layer secured, directly or indirectly via the optional sub-photoresist layer, to the exposed area of the glass fiber, wherein the photoresist layer comprises a negative photoresist composition or a positive photoresist composition; and a layer of microspheres, wherein the microspheres are transparent to the photolithographic radiation and have a nominal diameter in a range of about 500 nm to about 3 µm and are in a hexagonal closed packed configuration, and wherein the microspheres in substantially uniform contact with the photoresist layer;

wherein the microsphere photolithography comprises:

directing the photolithographic radiation toward the microsphere layer at an incidence having an polar angle ($\theta$) that is in a range of about −30° to about 30° and an azimuthal angle ($\varphi$) that is in a range of 0° to 360° for an exposure dosage that is in a range of about 0.1 mJ/cm$^2$ to about 25 mJ/cm$^2$ such that the microspheres focus the incident photolithographic radiation to produce an array of photonic jets that expose portions of the photoresist layer, wherein the exposed portions have:

locations that depend, at least in part, on the incidence;

diameters (d) that depend, at least in part, on the exposure dosage, wherein d is in a range of about 50 nm to about 750 nm;

a thicknesses of the photoresist layer; and a periodicity that depends, at least in part, on the nominal diameter of the microspheres and the incidence, wherein the periodicity is in a range of about 0.5 µm to about 3 µm;

wherein the exposed portions form a repeating pattern of a 2-D shape at the surface of the photoresist layer;

developing the exposed photoresist layer to remove the exposed portions, in the case of a positive photoresist composition, or the unexposed portions, in the case of a negative photoresist composition;

forming the nanoantennas on the portion of the exposed area of the glass fiber, if the optional sub-photoresist layer is not present, or the optional sub-photoresist layer, if present, in a pattern corresponding to the removed portions of the developed photoresist layer, wherein said forming of the nanoantennas is accomplished via etching of the optional sub-photoresist layer, if present, or depositing a nanoantenna material that comprises a comprises a metal, dielectric, semiconductor, or combination (e.g., a metal-insulator-metal structure); and removing the remaining photoresist to expose the nanoantennas;

thereby forming the network array of nanoantennas on the optical fiber.

Regarding the diameter of the microspheres, experimental results to date suggest that if the diameter is less than about 500 nm, this does not work well because it is desirable for the diameter to be at least about 1.5 times the wavelength of the photolithographic radiation. Conversely, if the diameters of the microspheres are greater than about 300 µm, there tends to be too few nanoantennas formed per unit of surface area, especially when the relevant surface area is the end of a 8 µm diameter core.

In one embodiment, the sub-photoresist layer metal and the nanoantenna material metal are independently selected from the group consisting of aluminum, silver, and gold; the sub-photoresist layer dielectric and the nanoantenna material dielectric are independently selected from the group consisting GaP, silica, and silicon; and the sub-photoresist layer semiconductor and the nanoantenna material semiconductor are independently selected from the group consisting of CdS and CdSe.

In one embodiment, the sub-photoresist layer semiconductor and/or the nanoantenna material semiconductor are in the form of quantum dots.

In one embodiment, the photolithographic radiation is selected from the group consisting of UV and laser light. Regarding the laser light, this involves multiphoton absorption. For example, two or more near infrared (e.g., 808 or 1025 nm) photons "simultaneously" hit the photoresist, which may be achieve using very bright, high photon densities from a femtosecond (aka ultrafast) laser.

In one embodiment, the nanoantennas are holes in the present optional first metal or semiconductor layer having a depth corresponding to that thickness of the optional first metal or semiconductor layer.

In one embodiment, the nanoantennas are columns extending from the exposed area of the glass fiber, if the optional sub-photoresist layer is not present, or the present sub-photoresist layer, and wherein the columns have a height that is in a range of about 25 nm to about 50 nm.

In one embodiment, the nanoantennas are columns extending from the exposed area of the glass fiber, if the optional sub-photoresist layer is not present, or the present sub-photoresist layer, and wherein the columns have a height that is in a range of about 700 nm to about 1.5 µm.

In one embodiment, the step of directing the photolithographic radiation comprises a multiplicity of particular combinations of the polar angle ($\theta$), the azimuthal angle ($\varphi$), and the exposure dosage so that the 2-D shape of the repeating pattern formed by the exposed portions is more complex than a single circle. For example, said complex 2-D shape may be selected from the group consisting of a multiplicity of spaced circles, split ring resonator, rod, multiple rods, dolmen-like, continuous line, and tripole. To form a continuous line, it is believed that the microsphere lattice orientation must be known.

In one embodiment, the microsphere layer is self-assembled on the photoresist layer.

In one embodiment, the microsphere layer is also affixed to a tape and the combination is reusable microsphere mask.

In one embodiment, the optical fiber assembly further comprises a ferrule in which the glass fiber is mounted.

In one embodiment, the optical fiber assembly comprises a multiplicity of the optical fibers such that the exposed areas of the glass fibers are coplanar.

BRIEF DESCRIPTION OF THE DRAWINGS

The accompanying drawings, which are incorporated in and form a part of the specification, illustrate the embodiments of the present disclosure and together with the description, serve to explain the principles of the disclosure.

FIGS. 2a to 2d illustrate steps of the MPL process according to FIG. 1.

FIGS. 4a to 4d illustrate a hole patterning technique, and FIGS. 4e to 4h illustrate a disk patterning technique.

FIGS. 9a to 9c illustrate formulas relating to EOT analysis.

DETAILED DESCRIPTION

Figure 1:
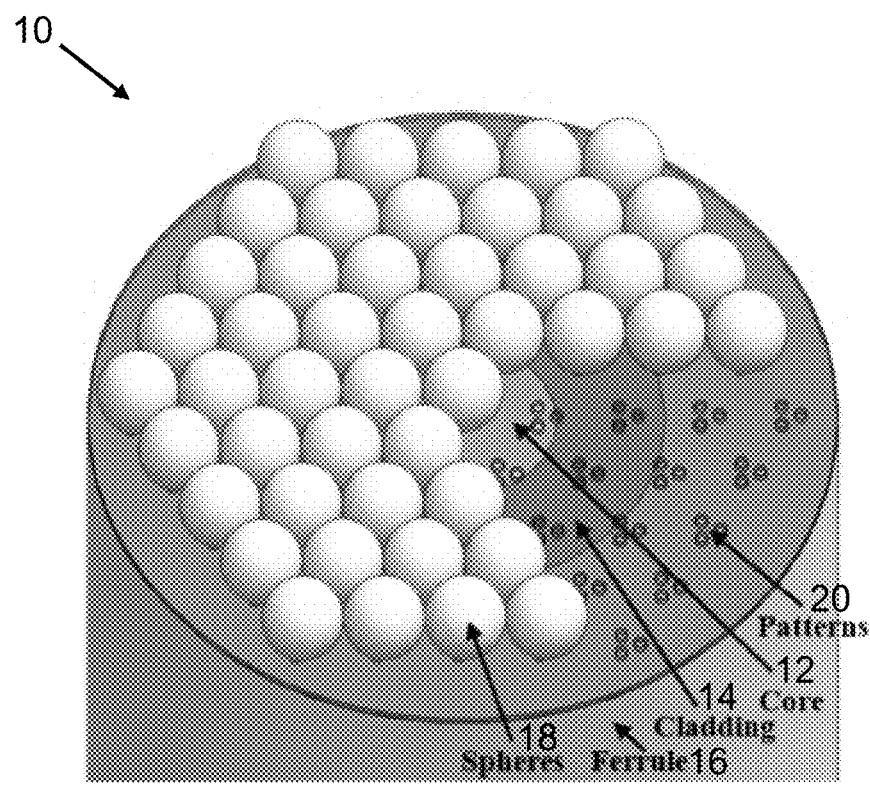
FIG. 1 illustrates one embodiment of an optical fiber fabricated with an MPL process.

Referring to FIG. 1, a high-level 3D illustration of a plasmonic optic chemical sensor design achieved by MPL fabrication is shown. As shown, an end tip of an optical fiber is the focus area for application of the MPL technique. An optical fiber assembly 10 includes a core 12, a cladding 14, and a ferrule 16, with the optical fiber itself being comprised of the core 12 and the cladding 14, for example. Microspheres 18 are formed on the (e.g., cleaved) face of the fiber, and, once exposed to UV radiation (and the fiber assembly 10 is otherwise post-processed), create patterns 20 on the face of the various components (e.g., core, cladding, etc.) of the fiber. The microspheres 18 comprise, for example, silica microspheres that are self-assembled to form an HCP array on top of a layer of a photoresist layer applied to the tip of the fiber, described in more detail later. The microspheres serve as an optical element and focus collimated UV radiation to an array of photonic jets inside the photoresist layer. The exposed region is dependent on the angle of incidence of the UV radiation which facilitates hierarchical patterning, and pattern transfer can be accomplished using either etching or lift-off with the size of the features dependent on the exposure dose, described in more detail later.

FIGS. 2a through 2d illustrate a more detailed 3D view of the stages of the MPL fabrication process on the tip of the fiber. FIG. 2a illustrates a thin metal (e.g., aluminum) film 22 formed on the fiber tip in the center (e.g., core and cladding). FIG. 2b illustrates microspheres 18 assembled on the tip, corresponding to the portrayal shown in FIG. 1. FIG. 2c illustrates a photoresist layer with patterns 20 left behind after processing and removal of the microspheres. The photoresist layer is applied to the metal layer prior to application of the microspheres. FIG. 2d illustrates a finalized state where holes 24 that correspond to the pattern 20 left by the UV exposure of the microspheres are etched in the metal layer. The holes may be located on any one or all of the fiber core, cladding, and ferrule, as desired. This type of hole formation represents an improvement over direct-write techniques, as the holes do not have to be formed in a slow, tedious manner as in FIB, and can instead be applied all at once via a relatively simple step. A more detailed explanation of the processes illustrated in FIGS. 2a through 2d is provided later.

Figure 3A:
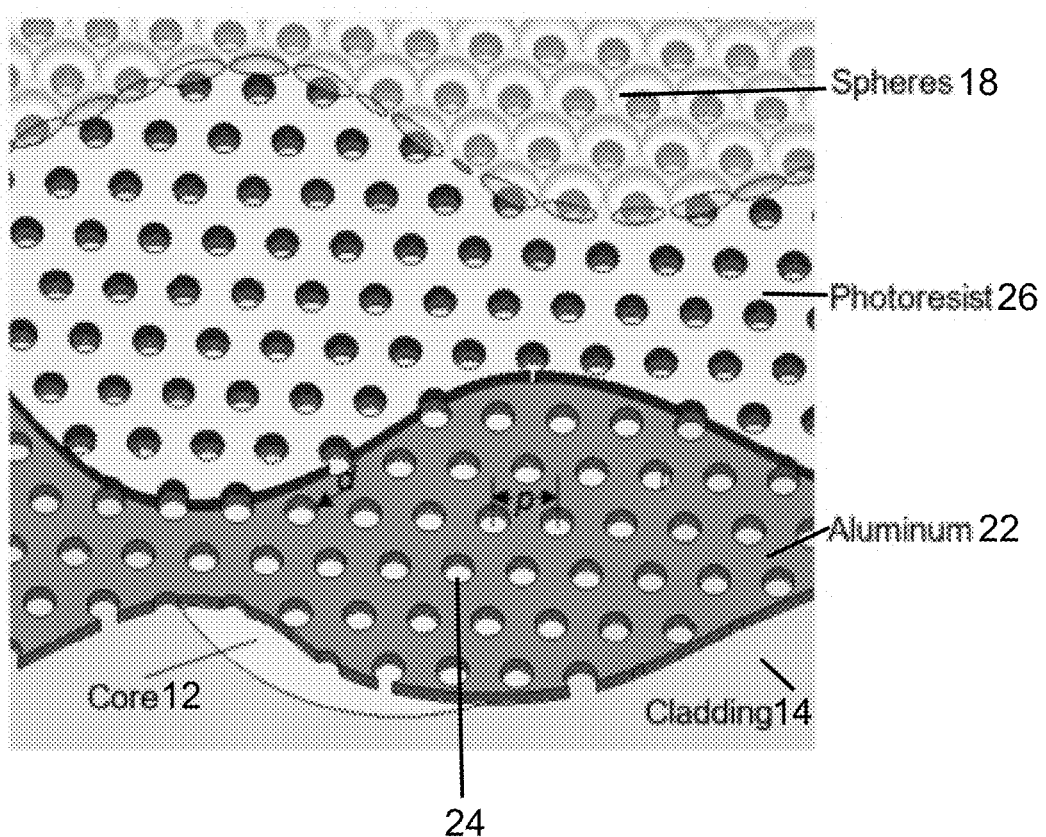
FIGS. 3a and 3b illustrate additional views of the MPL process and a resulting MPL-type optical fiber.
Figure 3B:
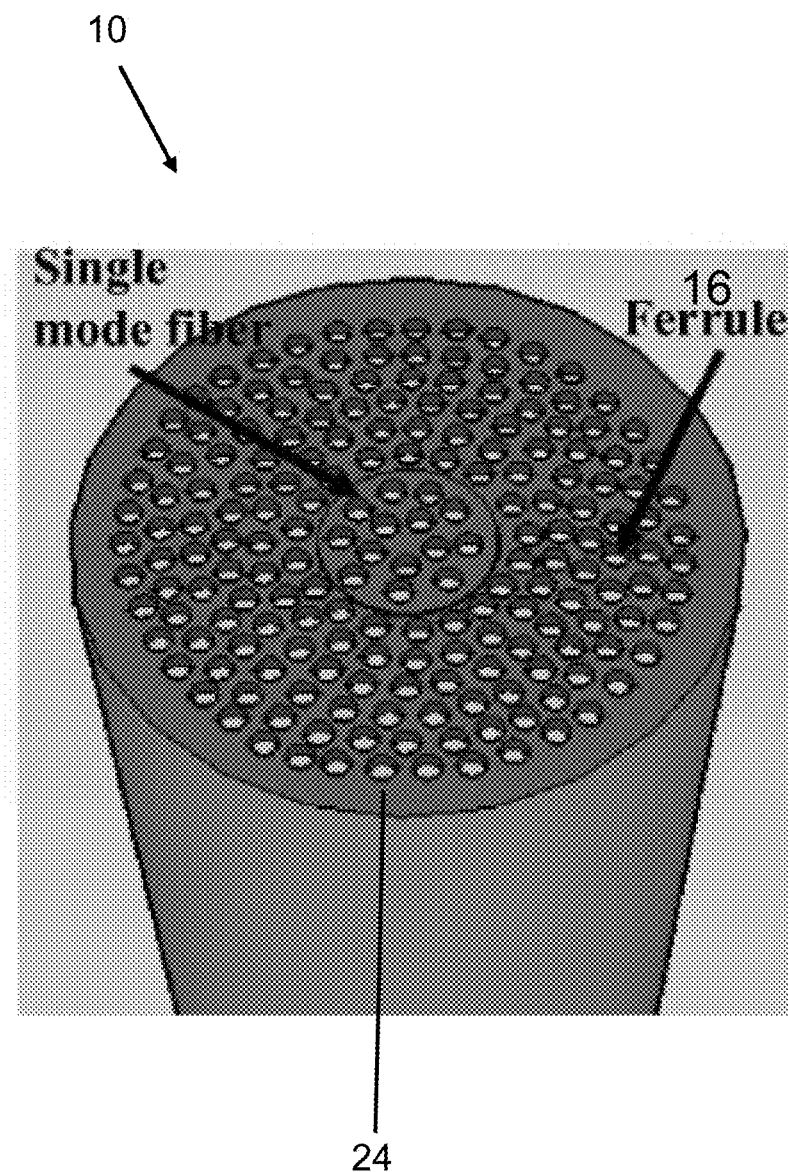

FIGS. 3a and 3b illustrate a schematic representation of a hole pattern of the fiber tip. The upper part of FIG. 3a shows the microspheres 18 assembled on a photoresist layer 26 on the fiber tip, before UV exposure. The lower part of FIG. 3a shows the aluminum layer 22 hole pattern after etching. Also illustrated is a diameter d of a hole 24 in the aluminum layer and a periodicity p amongst the holes 24. Hole diameter d, metal layer thickness t, and periodicity p are used to determine the resonant wavelength, and are tunable to match the medium of interest. These geometric parameters impact the characteristics (e.g., sensitivity and FOM) of the sensor. Because the periodicity p of the hole array only depends on the diameter of the self-assembled microsphere in the MPL process, diameter d and thickness t are the two parameters used in evaluations of sensor performance. The sensitivity (e.g., S) and related parameters (e.g., FOM) were examined with different d and t values. As hole diameter d increased (e.g., from 350 nm to 900 nm), the sensitivity rose at first and then dropped down sharply around 800 nm with five different t values. Holes with a diameter of less than 350 nm had no available sensitivity because the guided mode was cut off. The increase of the sensitivity from LSPR mode contribution can be predicted from known models for LSPR sensors. One such model gives a theoretical limit of the LSPR RI sensor is proportional to resonant wavelength $\lambda_0$, has the following form:

$$S < \frac{\lambda_0}{n} f \frac{2}{1+q} < \frac{\lambda_0}{n},$$

where $\lambda_0$ is the resonant wavelength, n is the refractive index, f is the ratio of the electric field distribution in the analyte to the substrate (always less than 1), and q captures the dispersion of metallic layer (always greater than 1). The theoretical limit of S has the form S<1.705d. As d increases, the resonant wavelength increases, and more electric field will be confined in the analyte resulting in a large f ratio that is eventually elevating the sensitivity. For the guided mode contribution, the resonant frequency for $TE_{11}$ mode is: $\lambda - \lambda_c = 1.705 d \cdot n$, where $\lambda_c$ is cut-off frequency, n is the refractive index of the propagating media and d is the diameter of the waveguide. However, for large holes, the sensitivity drops down very quickly due to the low selectivity of different wavelength, little light is blocked by the metallic layer, which undermines the sensing ability of the sensor. It is reasonable to anticipate the sensitivity goes down to zero as the hole area fraction approaching 1 (no features at the interface).

The thickness t also plays an important role in terms of sensitivity. The thicker the metallic layer, the steeper the S vs. d curve. This is explained due to the short propagation length, making it harder to stimulate SPP mode at the lower interface between metal and analyte. More energy will be coupled into the guided mode and the slope of the S vs. d curve approaching the limit with pure guided mode.

For FOM of the sensor, the FOM generally decreases as d increases, regardless of t. But increasing the thickness will be favored to have large FOM. The FOM is related to sensitivity and FWHM according to the definition defined above. A large FWHM is observed for large d. Consequently, even with large sensitivity for large holes, the FWHM still is the dominant factor for FOM, resulting in a continuous drop. On the other hand, a thicker metallic layer presents narrower resonant bandwidth accompanied by a tiny blue shift of the resonant wavelength. From a practical point of view, although the thick metallic layer will bring large sensitivity with large FOM, the sharper S vs. d curve indicates there will be a larger uncertainty of sensitivity with the same fabrication tolerance of d. A moderate thickness with an appropriate hole diameter would be more reasonable for cost-performance balancing.

Simulation results, described later, reveal how the geometric parameters of the cavity (e.g., hole) influence the performance of the sensor and how the present MPL fabrication technique could control such features.

FIG. 3b illustrates another high-level perspective of a finalized hole-patterned fiber assembly 10, similar to FIG. 2d. FIGS. 1-3 correspond to a preferred hole pattern embodiment. The various stages of the above-described techniques are described in more detail below.

With respect to fiber selection and initial preparation of the fiber for MPL treatment, single-mode fiber (e.g., Corning SMF-28) with a certain (e.g., 8.2 μm) diameter core and a certain (e.g., 125 μm) cladding can be used, and a ferrule (e.g., 2.5 mm outer diameter) may be used with the fiber. Once the ferrule and fiber are mated, the tip of the ferrule/fiber is polished and cleaned to provide a clean and smooth fiber end surface for application of a subsequent (e.g., metal) layer thereupon. Known polishing and cleaning techniques may be utilized for preparing the tip.

With respect to application of the metal layer on the tip of the fiber, in a hole-pattern embodiment as in FIGS. 1-3, a thin aluminum film is deposited on the polished and cleaned surface of the fiber tip using a desired technique (e.g., sputter deposition and the like). A layer of aluminum with a thickness of ~50 nm-100 nm is deposited (using an E-beam evaporator, for example), although the thickness is not limited to that specific range, and may be set to a desired thickness. Following the MPL process, the fiber/ferrule is immersed in an aluminum etchant for a period of time (e.g., 30 seconds). The etchant penetrates the open holes in the photoresist and attacks/removes the aluminum layer. Alternatively, the application of the metal layer may occur after application of the photoresist layer according to a disk pattern-based fabrication, depending on the desired final structural configuration of the (e.g., metasurface) features of the fiber tip.

Figures 4A, 4B, 4C, 4D, 4E, 4F, 4G, 4H:
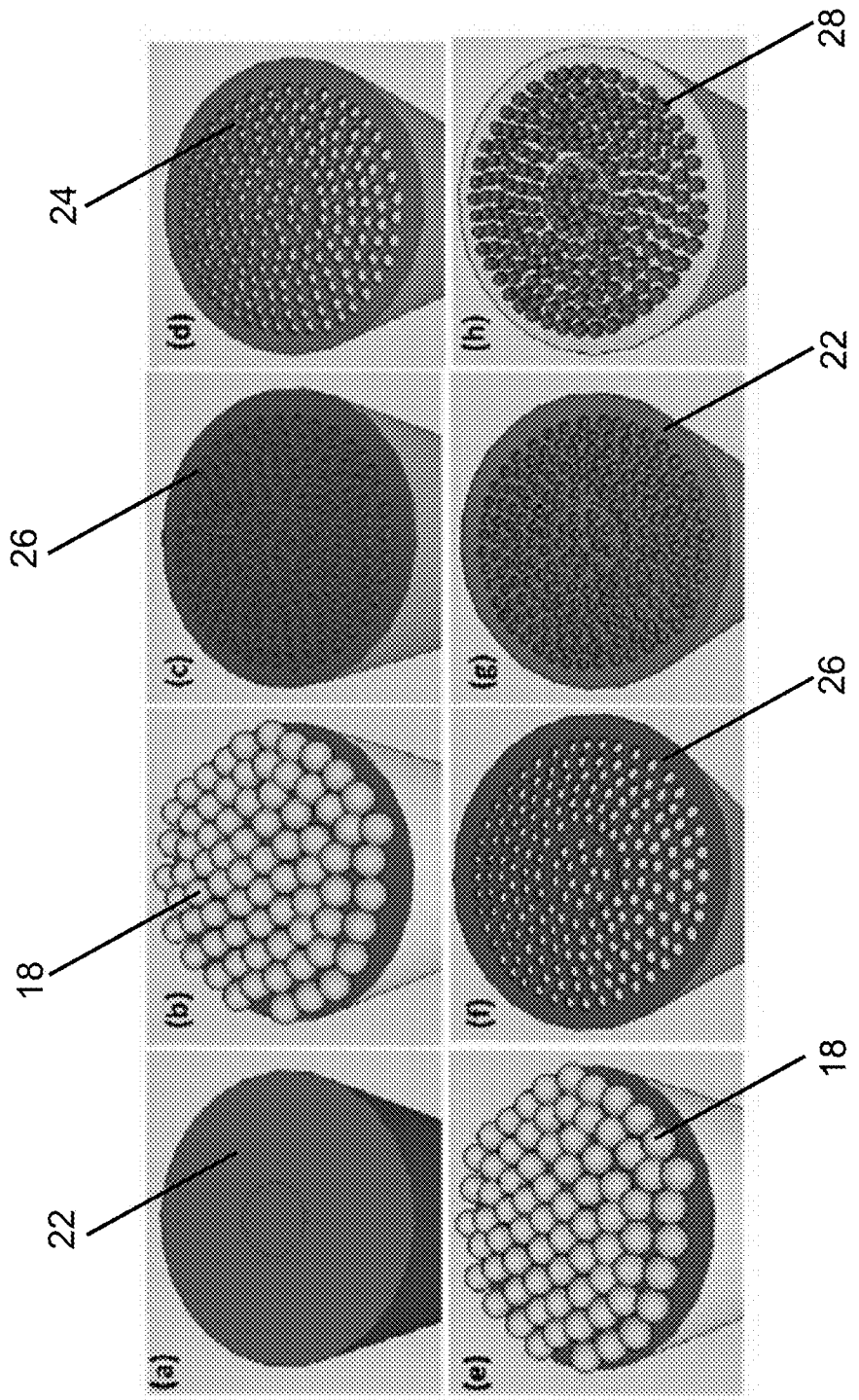
FIGS. 4a to 4h illustrate two different applications of the MPL process, where

FIGS. 4a through 4h illustrate a comparison of a hole pattern embodiment where the metal layer is applied before the photoresist layer (shown in FIGS. 4a to 4d), and a disk pattern embodiment where the photoresist layer is applied before the metal layer (shown in FIGS. 4e to 4h). FIGS. 4a to 4d illustrate a hole pattern embodiment where the final structure of the fiber tip includes a surface comprising patterned holes, such as is shown in FIGS. 1-3. FIG. 4a illustrates a thin film of aluminum (Al) on the fiber tip in the center (e.g., the core and cladding). FIG. 4b illustrates microspheres 18 on top of the metal layer 22. FIG. 4c illustrates a photoresist layer 26, having been patterned by UV exposure and removal of the microspheres. FIG. 4d illustrates a final structure of the fiber tip resulting from etching holes 24 in the metal layer. FIGS. 4e to 4h illustrate a disk pattern embodiment where the final structure of the fiber tip includes a disk pattern (the etching of the disk pattern embodiment leaves behind plated pillars/posts). FIG. 4e illustrates a layer of microspheres 18 on top of a photoresist layer. FIG. 4f illustrates the result of the microspheres having been processed (e.g., exposed to radiation) and removed, leaving a patterned photoresist 26 behind. FIG. 4g illustrates a thin aluminum film 22 applied to the patterned photoresist layer. FIG. 4h illustrates a final structure of the fiber tip including a disk pattern 28 after a lift-off (e.g., evaporation) process is performed to remove the undesired material. Whereas the hole pattern technique leaves behind a metal layer with holes therein (see FIG. 4d), the disk pattern technique leaves behind plated post/pillar structures (see FIG. 4h). The disk pattern technique may be used in conjunction with surface enhanced raman spectroscopy (SERS) techniques, described below in more detail. In a SERS application, gold (e.g., ~100 nm thick) may be used in place of aluminum.

Figure 5:
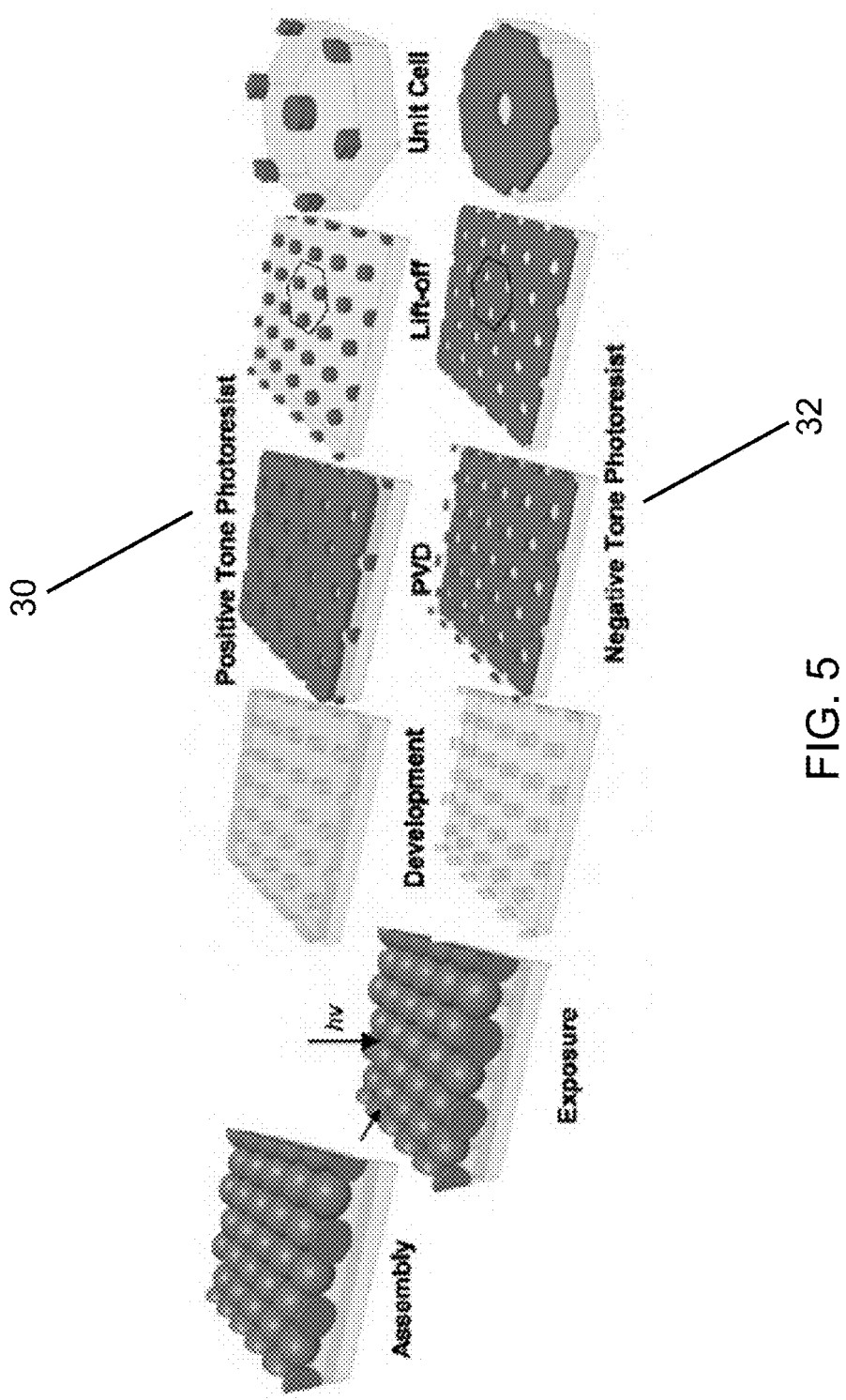
FIG. 5 illustrates additional aspects of the hole patterning technique according to FIGS. 4a to 4d and the disk patterning technique according to FIGS. 4e to 4h.

FIG. 5 further illustrates the differences in fabrication between the hole pattern technique and the disk pattern technique. FIG. 5 illustrates how a positive tone photoresist 30 results in one type of final surface structure, whereas a negative tone photoresist 32 results in a different type of final surface structure. The differences in the patterning types associated with the final structures shown in FIG. 5 are likewise evident when cross-referenced to FIGS. 4d and 4h. The hole pattern (e.g., FIG. 4d) generally produces minimum reflectance at resonance, while the disk pattern (e.g., FIG. 4h) generally produces maximum reflectance at resonance (resonant wavelength shifts as refractive index increases).

With respect to application of the photoresist layer, because of the small diameter of the fiber, surface tension can introduce significant edge effects during coating and produce a non-uniform thickness of the photoresist layer. To address this issue, the single mode fiber optics are integrated with silica/ceramic ferrules (~125-127 μm inner diameter), which may include shifting of the edge further away from the core by securing the fiber in the ferrule. Ferrule integration also provides easier handling of the fiber optic during fabrication and testing. Prior to inserting the fiber into the ferrule, the fiber jacket is removed from a portion (e.g., first 1-1.5 cm) of the fiber using a mechanical stripper. Before the stripped fiber is placed inside the ferrule, a small amount of epoxy/glue is injected inside the ferrule. The stripped end is positioned in the ferrule so the cleaved face is even with the face of the ferrule. The fiber/ferrule assembly is cured on a hot plate (e.g., at 100° C. for 10 minutes). Next, the face of the fiber/ferrule is polished and cleaned to have a good, clean and smooth fiber end surface, using known polishing and cleaning techniques in the art.

Further regarding the photoresist, the photoresist may comprise, for example, Shipley 1805 positive tone photoresist (e.g., Microposit), which is spin-coated onto the polished tip/ferrule, and then soft-baked at a suitable temperature (e.g., 90° C.). The ferrule is placed in a small chuck which allows the assembly to be secured on a spin coater. The photoresist may be formed to a thickness of 120 nm, for example. After etching, the photoresist is removed using a suitable solution (e.g., acetone).

Figure 6:
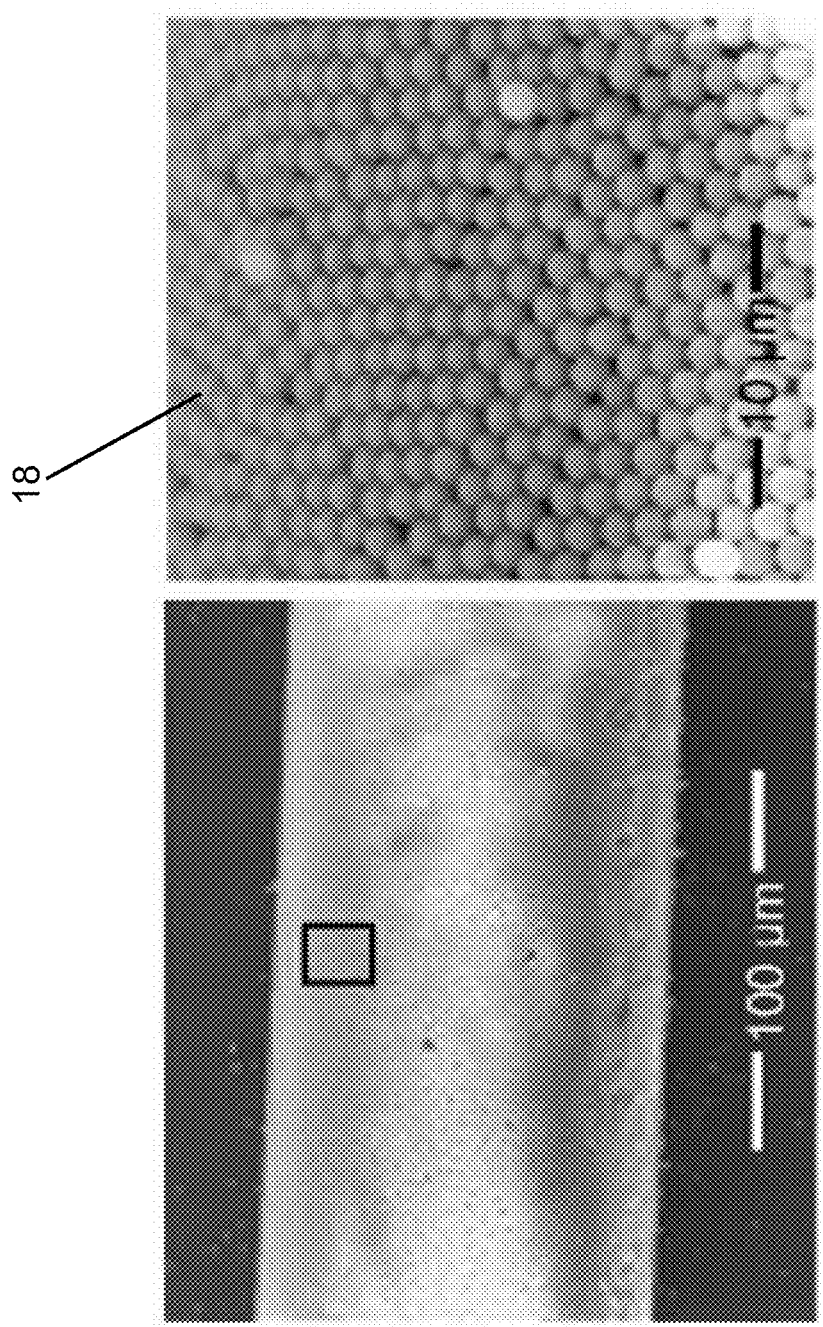
FIG. 6 shows scanning electron microscope (SEM) images of microspheres applied to an optical fiber.

With respect to application of the microspheres, FIG. 6 shows a scanning electron microscope (SEM) image of a self-assembled array of 2 μm diameter microspheres 18 that was applied to a 100 μm fiber. The microspheres may be applied to a surface of the fiber in two main ways. A first microsphere application technique comprises using a microsphere layer assembled on a water surface. For this microsphere application process, after spin coating, the ferrule is removed from the chuck and placed on a fixture which is submerged in a water-filled beaker. Microspheres are dispersed in a solution (e.g., a nonpolar liquid such as butanol) and allowed to self-assemble on the top surface of the water in the beaker. This helps spread the microspheres over the water surface. For example, after dispersing 50 mg of 1 μm diameter silica microspheres in 50 mL of butanol, the microsphere layer is assembled on the surface of the water by injecting 5 μl of the microspheres-butanol mixture on the water surface. After the microspheres stabilize, the water is then withdrawn from the beaker (e.g., via a drain formed in a lower portion of the beaker) to lower the self-assembled microsphere surface to the point that the fiber tip penetrates the surface of the water, and thus the microsphere array. This impingement process transfers the microsphere array to the tip surface of the fiber. Such transfer may not be limited solely to a cleaved face surface of the tip, but may also include transfer to a side surface of the fiber, depending on the orientation/angle at which the end of the fiber impinges the water surface comprising the assembled microsphere array. Patterning the side of the fiber would require removal of some portion of any external sheathing/sizing of the fiber, as well as performing local drawing and/or machining in order to utilize the optical energy in the fiber. The microspheres may have a diameter of ~1-1.5 μm, or other desired diameter. The fiber/ferrule is removed from the water after transferring the microsphere array. After the tip is dried (e.g., at room temperature), the microspheres are flood illuminated using an MA6 mask-aligner, for example. This provides spatially uniform collimated UV radiation at λ=365 nm (i-line), with an irradiance of 7 mW/cm$^2$. Each irradiated microsphere generates a photonic jet in the photoresist that creates a corresponding hole in the photoresist. After the exposure process, the fiber/ferrule is placed in a developer for a period of time (e.g., 60 seconds, although less time can be used depending on hole diameter size), and the microspheres are removed in the developer. The developed photoresist can be used as an etch mask for metal (deposited on the fiber/ferrule prior to spin-coating the photoresist) or for lift-off depending on the desired pattern.

A second technique for transferring a microsphere array to a surface includes a mask-based microsphere process. This second, mask-based technique provides for transferring a self-assembled microsphere array to a transparent tape, for subsequent application of the tape to a desired surface, thereby transferring the microspheres on the tape to the desired surface. This can be used for multiple exposures when pressed into contact with the photoresist. Similar to the first technique described above (the water surface-based technique), the goal of this second (mask) technique is to use self-assembled microspheres in direct contact with photoresist to focus collimated radiation to an array of photonic jets. A photonic jet combines near and far-field scattered radiation to produce a sub-diffraction field concentration propagating sustained over a wavelength in the photoresist. The electric field enhancement can be more than two orders of magnitude with a diameter as low as $\lambda_0/3$ FWHM. The large aspect ratio of the photonic jet facilitates pattern transfer via etching or lift-off. Complex patterns can be created by controlling the angular spectrum of the illumination, and are ideal for patterning metasurfaces in the mid-infrared and can be scaled to near-infrared and visible wavelengths. Using the microsphere array to focus light as opposed to using the microsphere array as a shadow mask has the advantage that it is not necessarily consumed during the patterning process. The goal of the mask technique is to create a uniform micro featured array over a cm$^2$ area using microsphere photolithography with a transportable mask. Mid-infrared metasurfaces are created by exploiting multiple exposures using the same mask. The performances of the metasurfaces are used to validate the consistency of the samples when the mask is used at different times.

Figure 7:
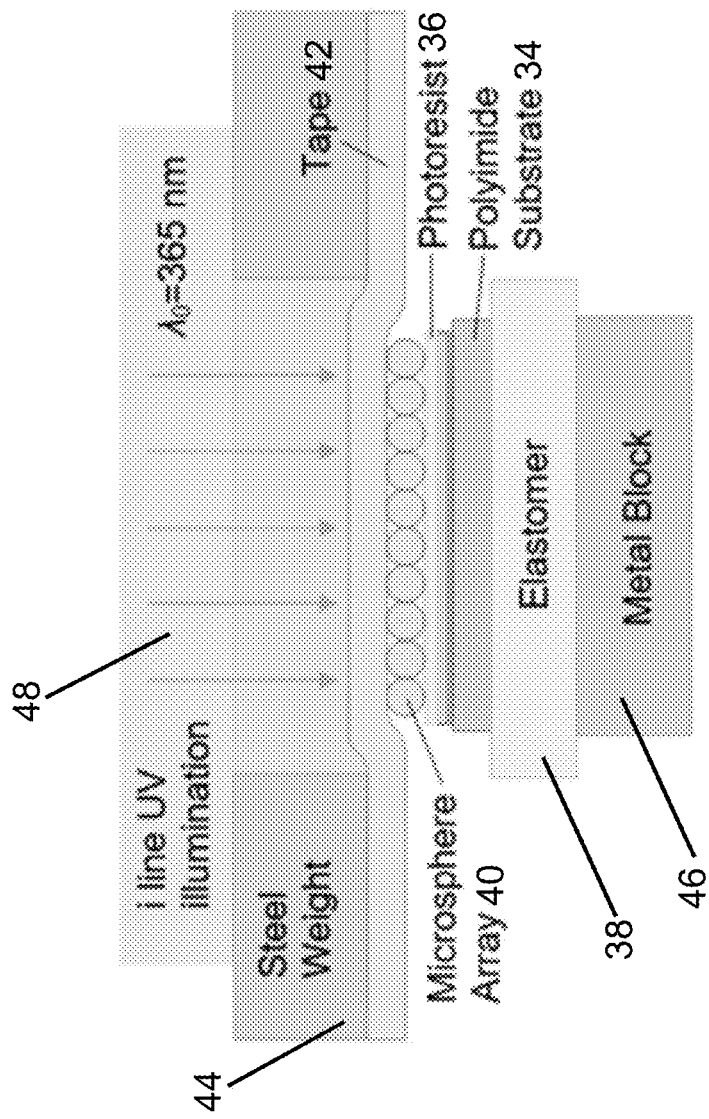
FIG. 7 illustrates a mask-based MPL technique.

FIG. 7 illustrates a setup for the mask-based microsphere photolithography technique. A thin polyimide substrate 34 that is 2 mil thick is spin coated with 480 nm of S1805 photoresist 36. This rests on an elastomer 38 (e.g., EcoFlex) of 5 mm thickness. A flexible mask in the form of an array hexagonal packed microspheres 40 secured by UV transparent tape 42 is pressed against the substrate 34 using a weight 44 which generates ~4 kPa across the interface. The center of the weight 44 is open to allow the microspheres to be (e.g., normally) illuminated with a collimated light source 48 through the tape 42. The conformal nature of the tape and substrate help to ensure good contact as the elastomer helps to distribute the load over the interface. The elastomer 38 is located on top of a metal block 46. The preparation of the mask (e.g., 40 and 42) begins with the spontaneous self-assembly of a microsphere array on air-water-interface as described above with the beaker. Dry silica microspheres (2 μm diameter) are first mixed into 1-Butanol solution with a concentration of 300 mg/m L. A glass slide is inserted vertically into a (e.g., Teflon) beaker containing deionized water sufficiently deep enough to submerge the slide. The microsphere/Butanol mixture is dispensed onto the surface of the deionized water. Capillary forces cause the microspheres to self-assemble into an HCP lattice on the air-water interface. A portion of the microsphere array is transferred onto the glass slide when the slide is slowly removed from the deionized water at a speed of 0.016 mm/s. The sample, tape mask and metal block are coarsely aligned before illumination with i-line ($\lambda_0$=365 nm) radiation with irradiation, E=12.5 mW/cm$^2$ for a time period such as 3 seconds. Each microsphere generates a photonic jet in the photoresist. The sample is then soft baked at 115° C. for a time period (e.g., 90 seconds) before developing in a developer (such as Microposit MF319) for a certain time (e.g., 60 seconds) to reveal an HCP hole array (the diameter of the holes is ~940 nm). The periodicity is determined by the diameter of the microspheres while the hole diameter can be controlled by adjusting the exposure fluence. Following inspection of the microsphere array on the glass slide, it is transferred to the tape by carefully pressing the adhesive coated side of the tape to the microspheres. The microsphere array covers ~25×25 mm$^2$ area on the tape. While FIG. 7 depicts forming a microsphere layer on a photoresist of polyimide substrate, the mask-based technique can be used to apply a microsphere layer to a photoresist of the optical fiber tip as described above. Reusing the microsphere array reduces the expense of the process. The mask formed by transferring the self-assembled microsphere array to the transparent tape can be used for multiple exposures when pressed into contact with the photoresist.

With respect to radiating the microspheres to form holes in the photoresist, regardless of if the microspheres are applied to an intended surface via the water surface-based impingement technique or the tape-based mask technique, the transferred microspheres, in a most basic aspect, are normally (aka perpendicularly) illuminated with i-line UV radiation using an MA6/BA6 mask aligner, for example. Each microsphere focuses the incident radiation to a photonic jet inside the resist and thus exposes a small hole directly beneath the microsphere. After development the exposed area of the aluminum film is removed using wet etching (isotropic), for example. Finally, the photoresist is stripped using a solution (e.g., acetone, isopropyl alcohol (IPA) and distilled water) to reveal the patterns.

Figure 8A:
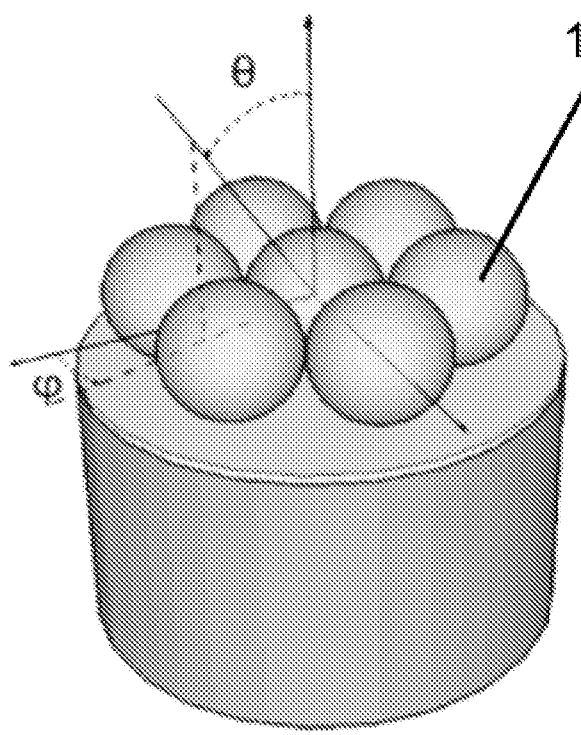
FIGS. 8a to 8c illustrate off-axis radiation techniques and related equipment.
Figure 8B:
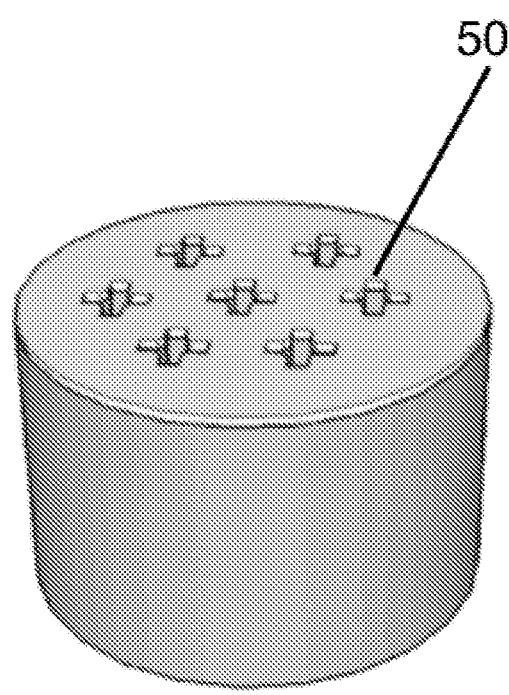
Figure 8C:
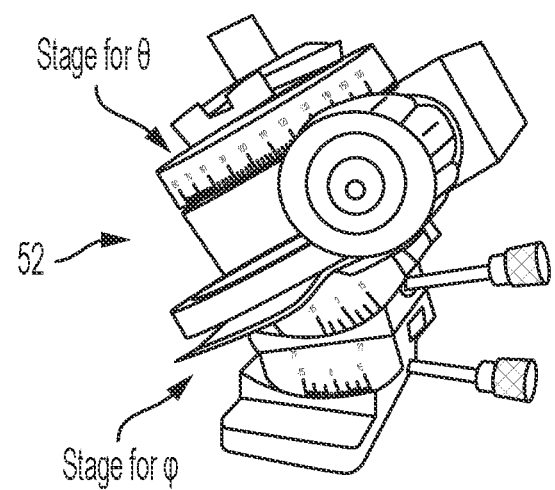

A more advanced radiation technique comprises off-axis (e.g., non-normal) radiation. FIGS. 8a to 8c illustrate aspects of the off-axis UV radiation technique. FIG. 8a illustrates controlled angles at which microspheres 18 of a self-assembled microsphere array (such as 40 in FIG. 7) on top of the fiber face are exposed to UV light. These controlled angles include θ and φ, and FIG. 8b illustrates the patterns 50 that result from tilting an optical/rotational stage 52 as shown in FIG. 8c between θ and φ. For example, multiple nano structure fabrications by utilizing off-axis UV exposure can be achieved on single mode fiber tip. The tilting process is as follows. Microspheres are self-assembled onto the photoresist of the fiber tip surface. After excess solvent is evaporated, and the fiber, along with the chuck, is mounted to an optical stage (e.g., 52) and exposed under UV light at angle measured from the surface, including θ (polar angle) and φ (azimuthal angle) which can be controlled by tilting the stage 52. Each microsphere 18 can focus the UV light into a photonic jet into the thin photoresist. The angle of the photonic jet is controlled by the stage 52. Different combinations of θ and φ will give different nanostructures (e.g., 50) for desired optical applications. The range of θ is from −30° to 30°, and the range of φ is from 0° to 360°. Different combinations of polar angle (θ), azimuthal angle (φ), microsphere and exposure dose determine the shape and the size of the nano structure that is created. Fiber mounted on the rotational stage that can control the angles are placed under the UV source and exposed with a certain amount of dose, following by aluminum etching (or deposition) to create different structures (the aforementioned holes and disks). By changing the angle-of-incident UV illumination (off-axis) and mapping the ability to steer the photonic jet around the unit cell defined by the microsphere array, complicated nano structures are successfully created. The off-normal UV radiation process therefore allows for fabrication of more complex structures than the normal UV radiation technique. Experimental results of the off-axis radiation technique are described later.

To achieve the required sensing goals, a thin film aluminum layer perforated with nano holes was implemented on top of a single mode fiber optic in an Extraordinary Optical Transmission (EOT) configuration based on the refractive index change at the fiber interface. At resonance, EOT decreases the reflection from the fiber tip. The conditions for resonance are dependent on the local environment surrounding the fiber tip and the resonant wavelength can be used to measure the index of refraction of a liquid. The Bloch-mode theory is believed to confirm EOT behavior of a metal nano hole structure. The Bloch theory described localized transmitted light through the arrays of holes and improved evanescent field at the hole structure. The theory is based on the transmission through the metal subwavelength holes along with the surface plasmon polariton (SPP) scattering processes by the nano structure holes. The transmission coefficient doesn't depend on the hole shape, while it does depend on the hole size. The electromagnetic (EM) fields are treated in the metal surface through impedance boundary condition(s) where the frequencies are less than the metal plasmonic frequency. A linear expansion of S and P plane waves in 1 and 3, and the Bloch wave regions merging TE and TM waveguide modes inside the holes construct the EM fields.

FIGS. 9a to 9c represent formulas used for analyzing EOT. FIG. 9a depicts an expression in terms of transmission and reflection, where $t_{if}$ represents the probability amplitude of an arbitrary incident transmitted from region 1 EM plane wave (i) to be transmitted to an outgoing plane wave (f) in region 3. The quantities $\tau^{12}$, $\tau^{23}$, $\rho^R_{ay}$, and $\rho^L$ are the scattering matrix components for a single interface between 1 and 2 mediums or 2 and 3 mediums. The quantity $\rho^R_{\alpha\gamma}$ is the amplitude of reflection in mode α moving through the waveguide toward region 1 and reflected away in mode γ for 2-1 interface scattering and $\rho^R_{\alpha\gamma}$ is from 2-3 interface. The exposure dose is controlled by changing the exposure time duration according to the formula in FIG. 9b, where $I_{int}$ is the UV lamp intensity from the power source, and $t_{dose}$ is the exposure time. The power intensity ($I_{pr}(x, y, z)$) would be redistributed based on the location inside the photoresist, expressed as the formula in FIG. 9c, where $E_{int}(x, y, z)$ is the electromagnetic field intensity corresponding to $I_{int}(x, y, z)$.

Experimental results of the MPL techniques and sensors fabricated according to the processes described above are presented below. Devices were designed and fabricated to perform chemical sensing of different mediums, including glucose (e.g., in the form of sugar water) and salt (e.g., in the form of salt water) concentration measurements. A change in refractive index of the ambient medium results in a change of the plasmonic resonance at the thin metal surface.

Figure 10:
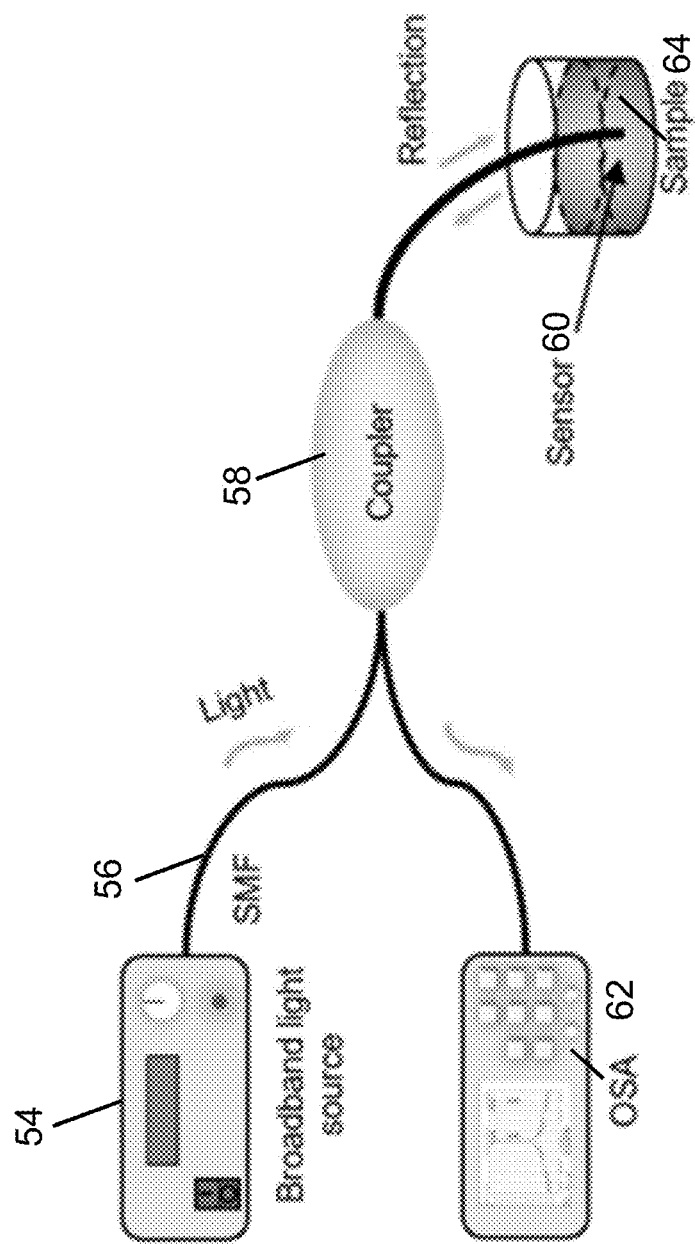
FIG. 10 illustrates a test setup for testing of an optical fiber sensor fabricated using MPL.

FIG. 10 represents an illustrative testing setup for refractive index measurements for a (e.g., biochemical) sensor fabricated according to the MPL techniques of the present application. The setup has a (e.g., broadband) light source 54, a bifurcated single-mode fiber cable 56, a coupler 58 (as needed), a sensor 60 made according to the MPL technique described herein, and an optical spectrum analyzer (OSA) 62. The sensor 60 is placed in a sample solution 64 (e.g., sugar or salt water) to test the sensing ability of the sensor. The light source 54 may be an Agilent 83437A light source and the OSA 62 may be an Ando AQ6317B OSA. The light source 54 may be a 4 LEDs wide band light source that feeds a 400 nm light spectrum through the single-mode optic coupler to the sample patterned fiber tip. The light will go through the patterned holes and will reflect due to the change of the refractive index of the light through the medium the sensor is placed in. The reflected light will go back through the bifurcated cable to be scanned and interpreted by the light spectrum analyzer. The pattern on top of the sensor head may be small holes in a thin deposited aluminum layer created by the present hole pattern technique described herein. The location of the dip in the light reflection spectrum depends on the diameter of the holes, the distance between two adjacent holes centers, aluminum thickness, and the number of the holes in the fiber core.

Figures 11A, 11B, 11C, 11D, 11E, 11F:
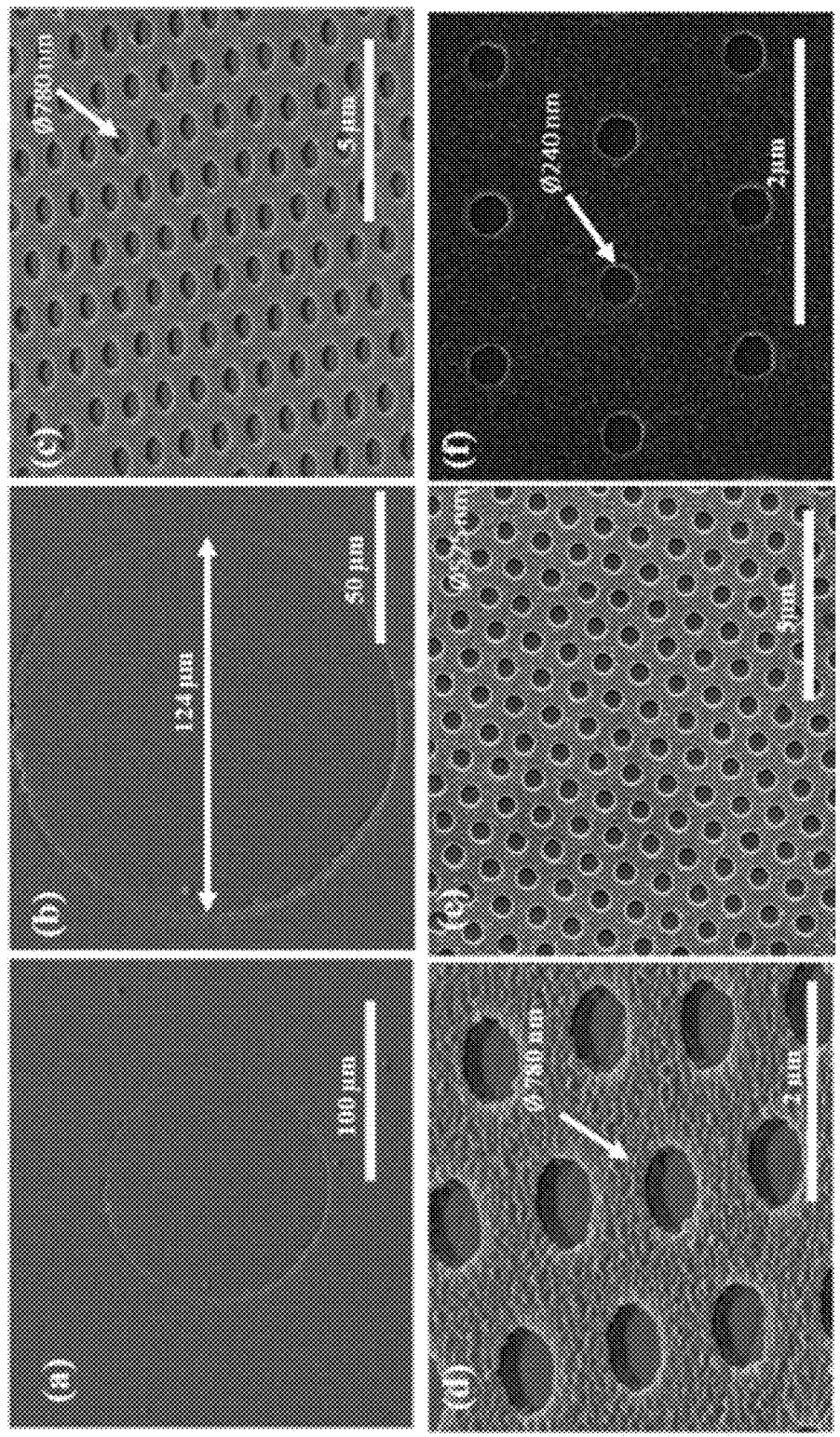
FIGS. 11a to 11f show SEM images of experimental hole pattern fabrication.

FIGS. 11a to 11f show SEM micrographs a plasmonic metasurface fabrication of a single mode fiber of 125 μm cladding diameter and an 8.2 μm core diameter. FIG. 11a shows a top view of a fiber in a ferrule. FIG. 11b shows an enlarged view of the diameter of the fiber with patterned holes on top. FIG. 11c shows an even more magnified view of the patterned holes on the fiber. FIG. 11d shows a further zoomed image and that the patterned holes have a diameter of 780 nm. FIG. 11e shows hole patterns in an aluminum layer with a diameter of 525 nm, and FIG. 11f shows a diameter of 240 nm.

Figures 12A, 12B, 12C, 12D:
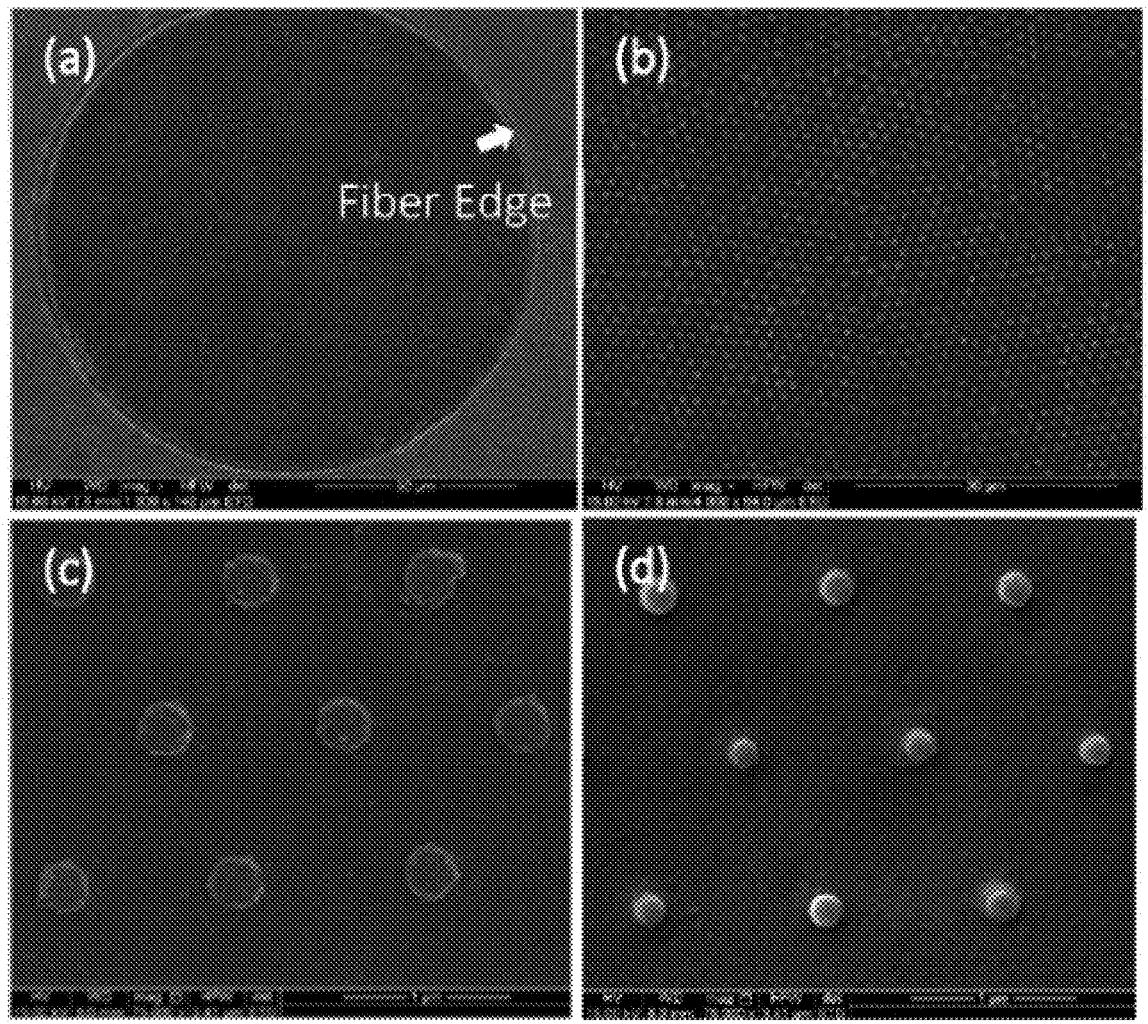
FIGS. 12a to 12d show SEM micrographs of experimental disk pattern fabrication.

FIGS. 12a to 12d show SEM micrographs of the top view of the fiber inside the ferrule. FIG. 12a shows that the edge is the interface of the fiber and ferrule. FIG. 12b shows a magnified view of the fiber, with a round shape disk from aluminum deposition (130 nm thick). FIG. 12c shows a 340 nm disk, and FIG. 12d shows a 170 nm disk.

Figures 13A, 13B:
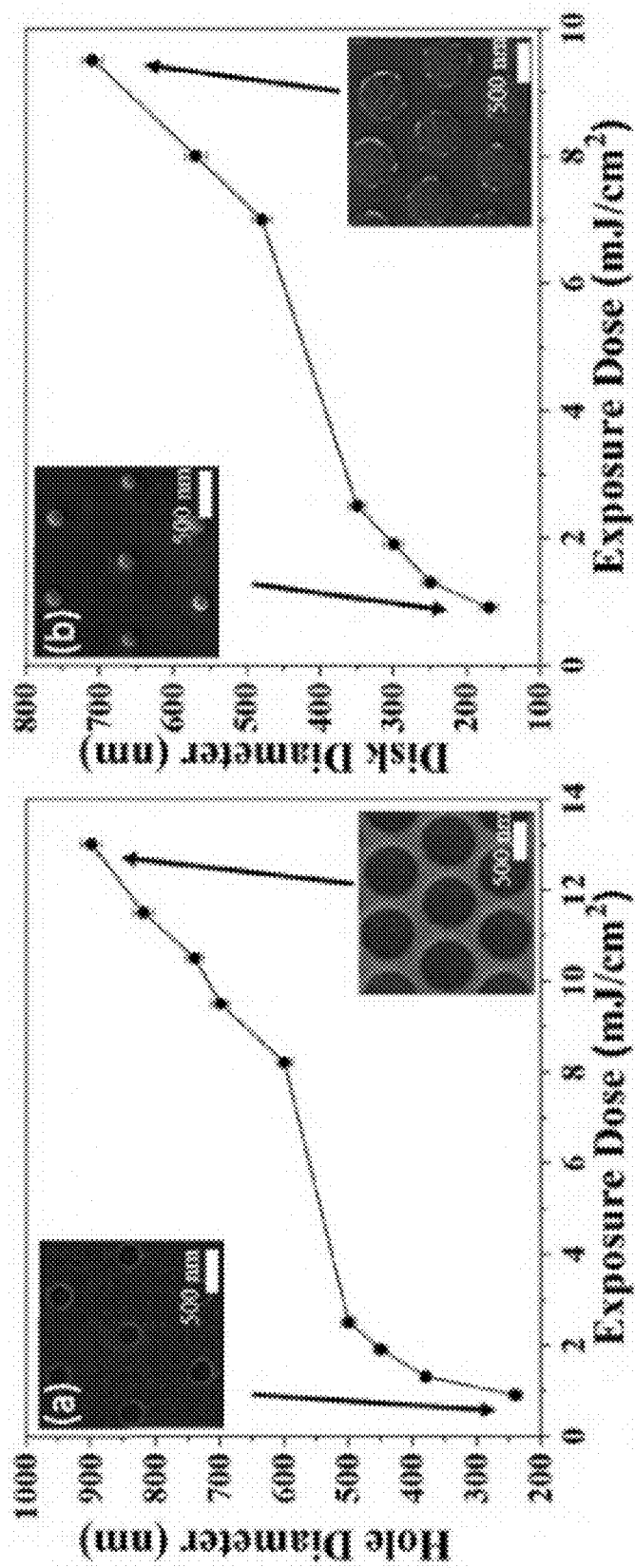
FIGS. 13a and 13b show SEM micrographs and illustrate test results for an off-axis radiation exposure process used with hole/disk patterning techniques.

FIGS. 13a and 13b show SEM micrographs and illustrate test results with respect to the above-noted off-axis UV exposure process and the hole/disk patterning techniques. As shown, the amount of UV exposure impacts pattern size. FIG. 13a shows an aluminum hole formed by etching after the above-described hole-patterning process was conducted, and FIG. 13b shows an aluminum disk formed by lifting off after the above-described disk patterning process was conducted. The charts show the relationship between exposure dose and hole/disk diameter. For a disk diameter of less than 400 nm and holes less than 500 nm, a thinner photoresist (120 nm) and a shorter developing time (7 seconds) were used.

Figures 14A, 14B, 14C, 14D, 14E, 14F:
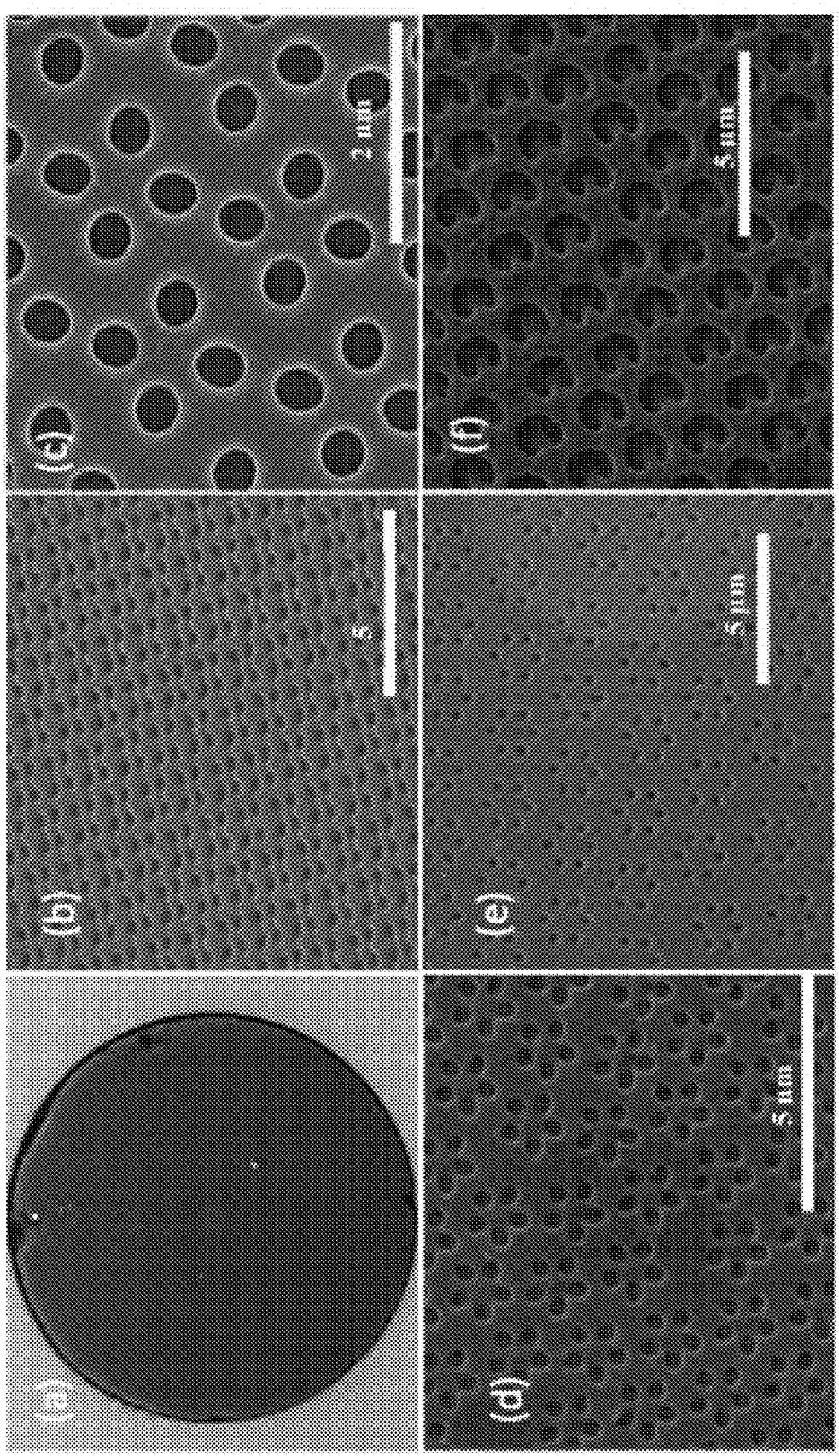
FIGS. 14a to 14o show SEM images of experimental nano structures created with various control parameters.
Figures 14G, 14H, 14I, 14J, 14K, 14L:
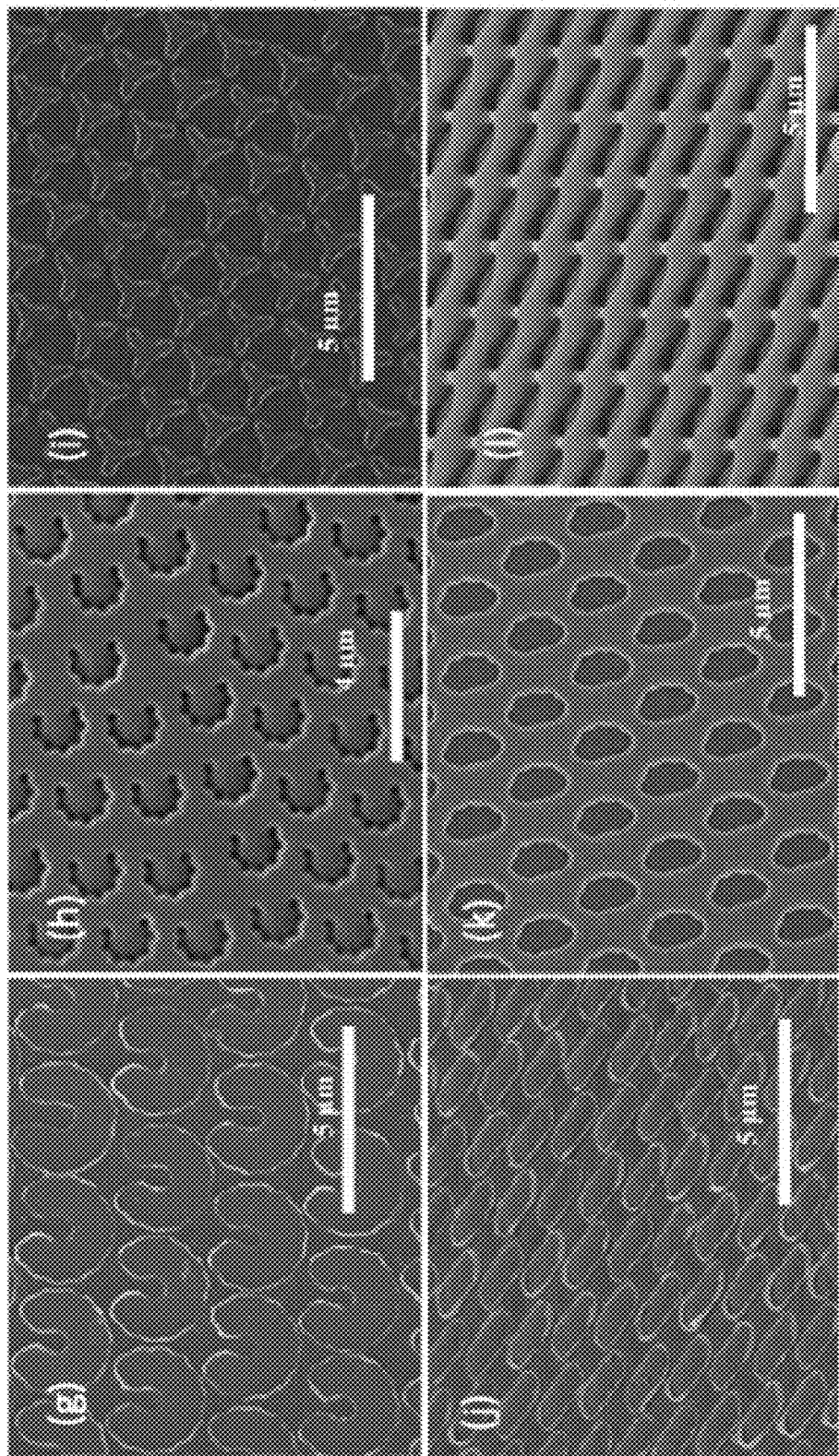
Figures 14G, 14H, 14I, 14J, 14K, 14L:
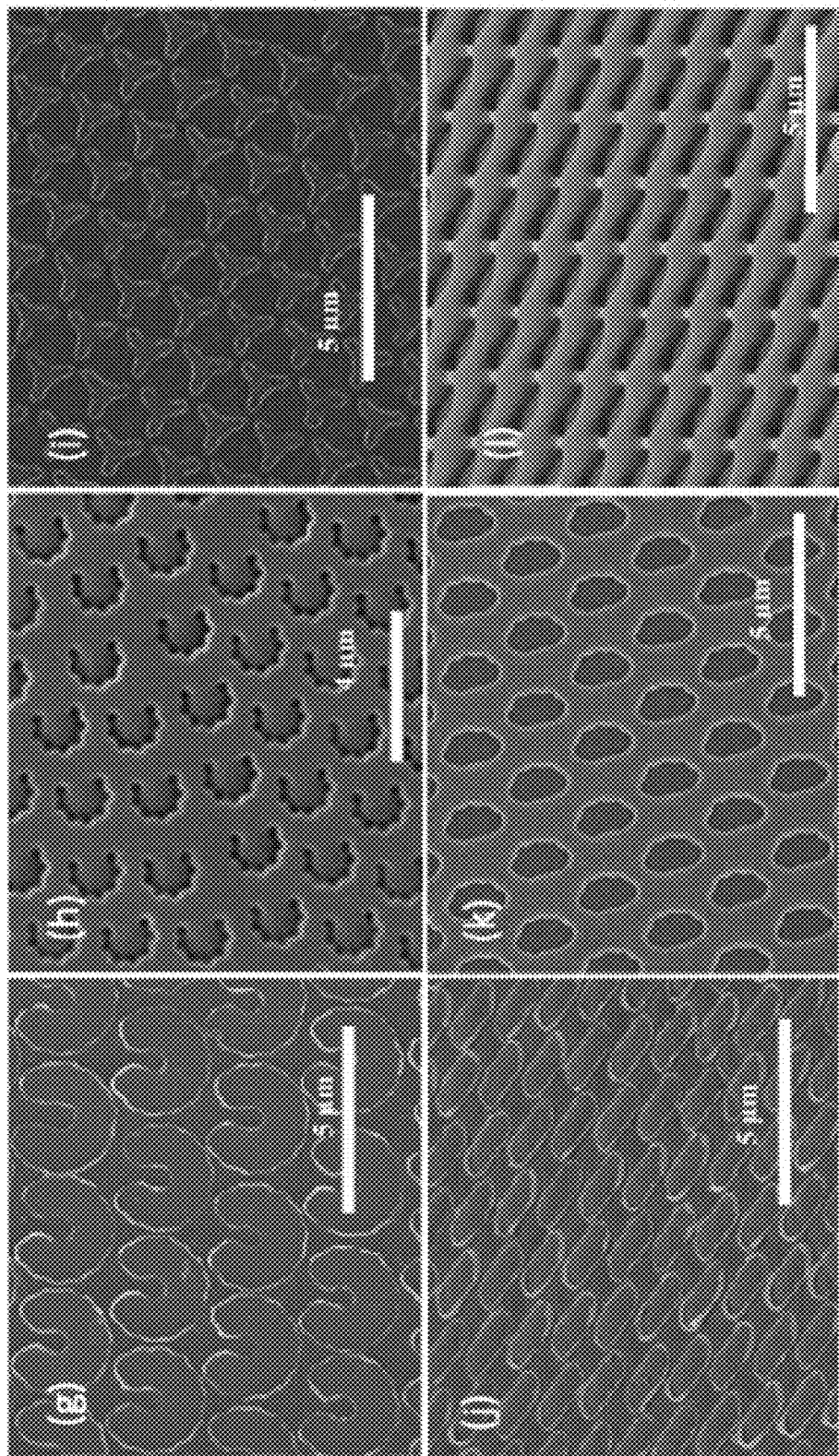
Figures 14M, 14N, 14O:
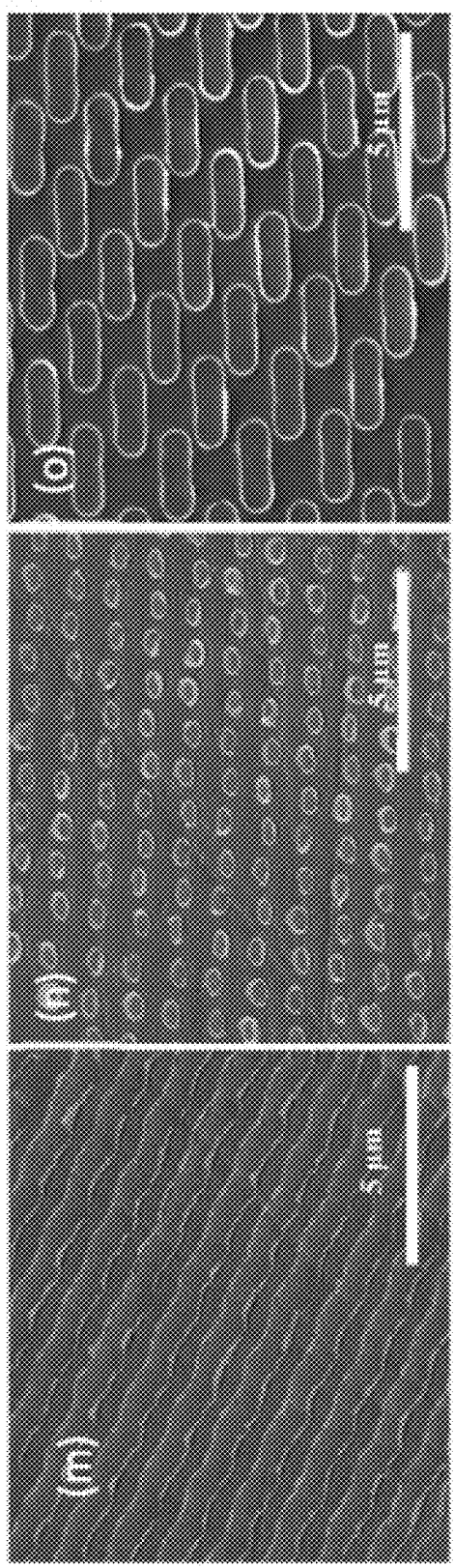

FIGS. 14a to 14o show SEM micrographs of nano structures created with various control parameters. FIG. 14a shows the fiber inside the ferrule. FIG. 14b shows exposures with θ=30° and φ=0°, 90°, 180°, and 270°. FIG. 14c is a magnified top view of FIG. 14b. FIG. 14d shows exposures with θ=30° and φ=0°, 72°, 144°, 216° and 288°. FIG. 14e shows exposures with θ=30° and φ=0°, 60°, 120°, 180°, 240° and 300°. FIG. 14f shows exposures with θ=30° and φ=0° through 240° (in 20° increments), following aluminum etching. FIG. 14g shows exposures with θ=30° and φ=0° through 240° (in 20° increments), following aluminum deposition. FIG. 14h shows exposures with θ=30° and φ=0°, 40°, 80°, 120°, 160°, 200° and 240°. FIG. 14i shows exposures with θ=30° and 10°, and φ=0°, 120°, and 240°. FIGS. 14j to 14m show exposures with θ=30°, 10°, −30°, and −10° and φ=180°, where the orientation of the microsphere leads to a different shape of the final structure, FIG. 14j and FIG. 14m are from aluminum deposition and lift-off, and FIGS. 14k and 14l are from aluminum etching. FIGS. 14n and 14o show additional patterns made by altering θ and φ.

Figures 15A, 15B, 15C:
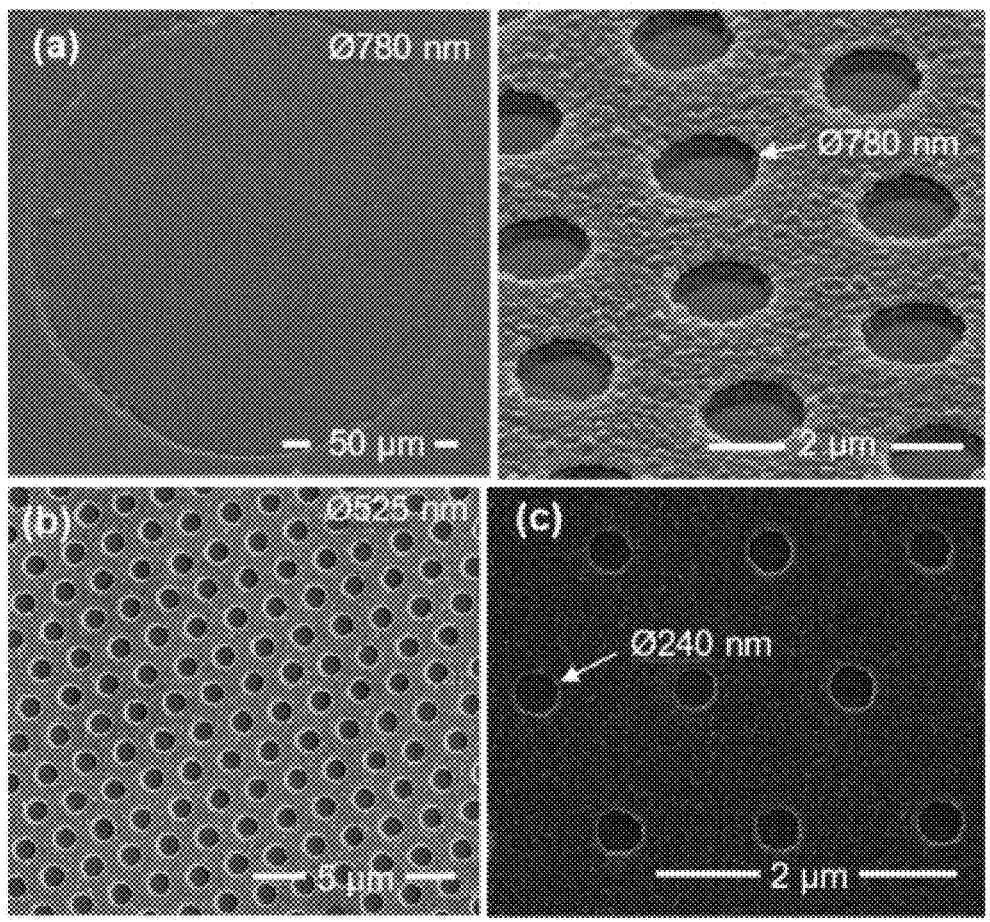
FIGS. 15a to 15c show SEM images of an experimental hole-patterned optical fiber.

FIGS. 15a to 15c show SEM micrographs of an optical tip that has been patterned according to the above-described hole-patterning technique. FIG. 15a shows a ferrule/fiber assembly patterned with 780 nm holes. FIG. 15b shows patterning with 525 nm, and FIG. 15c shows patterning with 240 nm holes. As shown in each of FIGS. 15a to 15c, at the end of the process, the fiber tip is covered by a continuous aluminum film perforated by uniform holes. The patterns shown in FIGS. 15a to 15c can be used as a basic RI sensor. The devices were tested by immersing the tips in different concentrations of sugar-water. The end of the fiber opposite of the patterned tip/ferrule assembly was fusion-spliced to a bifurcated fiber with the opposite ends connected to an Agilent 83437A light source and an Ando AQ6317B OSA. This setup allowed the reflectance spectrum to be measured.

Figures 16A, 16B:
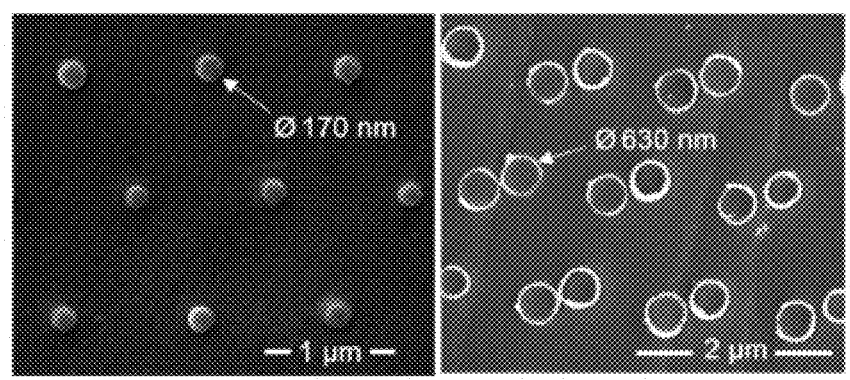
FIGS. 16a and 16b show SEM images of an experimental disk-patterned optical fiber tip.

FIGS. 16a and 16b show SEM micrographs of patterned optical fiber tips with lifted off features. FIG. 16a shows 170 nm disks and FIG. 16b shows two closely spaced 630 nm disks. the results of patterns created with MPL and lift-off on the tips of optical fiber. Features smaller than 200 nm can be readily patterned on optical fiber when the sample is tilted under the i-line UV light source by ±15° and exposed. This creates two holes in the photoresist which become two closely spaced disks after lift-off. More complicated orientation/exposure schemes on rotation stages (such as shown in FIG. 8c) have been used to create Split Ring Resonators and tripoles on planar substrates. FIGS. 15 and 16 demonstrate the application of MPL to pattern optical fiber and creation of functional refractive index probes. The ability to pattern multiple fibers in parallel dramatically reduces the cost of plasmonic probes.

Figure 17A:
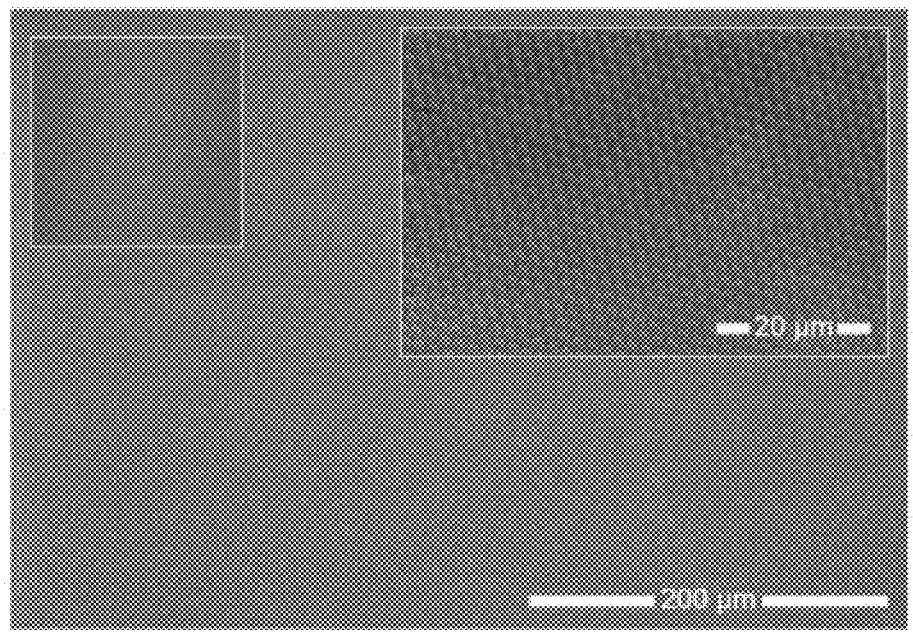
FIGS. 17a and 17b show SEM images of experimental structures created via a mask-based MPL process according to FIG. 7.
Figure 17B:
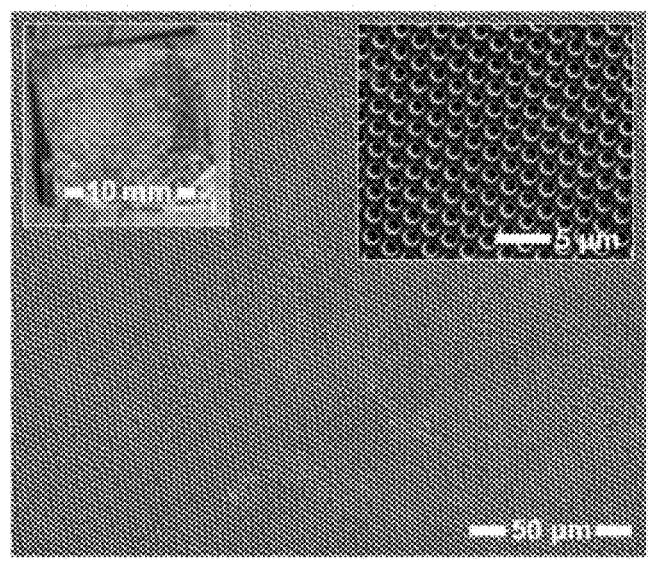

In connection with the techniques illustrated in FIG. 7, FIG. 17a shows SEM images of the microsphere mask (tape) along with a 2D Fourier Transform of the image, with the inset showing 2D Fourier Transform. The sample, tape mask and metal block are coarsely aligned before illumination with i-line ($\lambda_o$=365 nm) radiation with irradiation, E=12.5 mW/cm$^2$ for 3 seconds, for example. Each microsphere generates a photonic jet in the photoresist. The sample is then soft baked at 115° C. for 90 seconds before developing in MF319 for 60 seconds to reveal an HCP hole array. FIG. 17b shows the sample after development, where the SEM image shows holes in S1805 photoresist. The diameter of the holes is ~940 nm. The periodicity is determined by the diameter of the microspheres while the hole diameter can be controlled by adjusting the exposure fluence. The hole array created by the lithography process can be used for pattern transfer by either etching or the lift-off procedure.

Figures 18A, 18B, 18C, 18D:
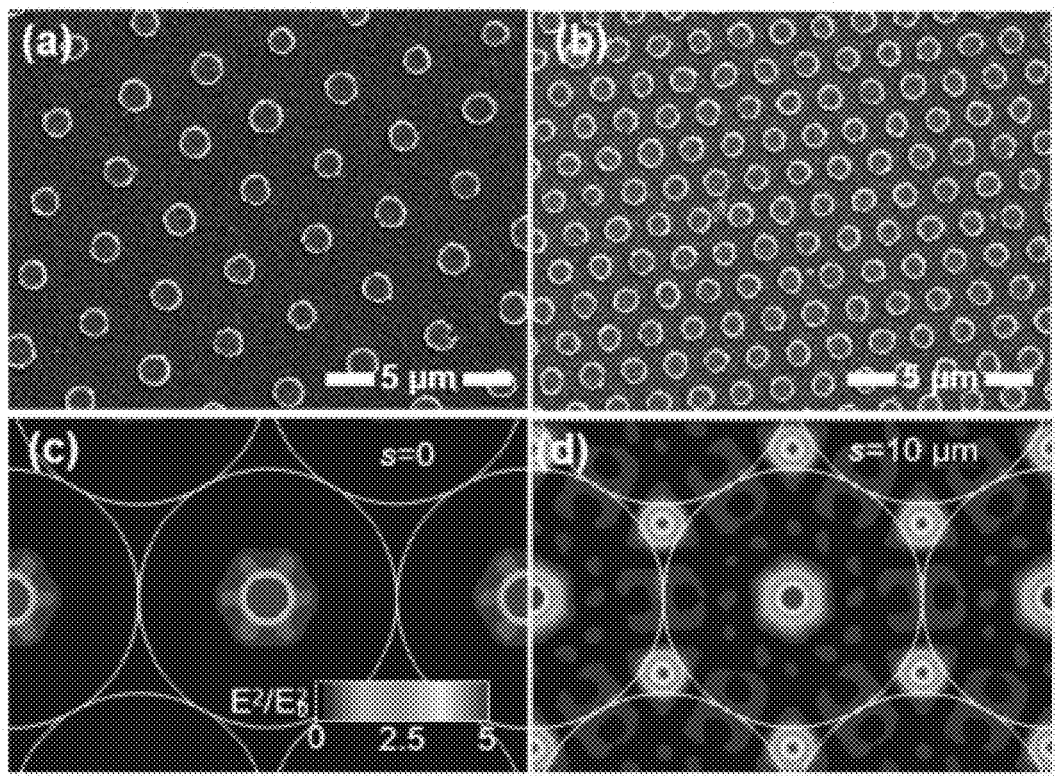
FIGS. 18a to 18d show SEM images of experimental structures created via a mask-based MPL process according to FIG. 7 and corresponding simulations.

FIGS. 18a to 18d show various SEM images and plots in connection with aspects regarding separation between the microspheres and the photoresist, and illustrate the importance of controlling the separation between the microspheres and the photoresist. The experimental results show the change in pattern periodicity due to diffractive effects at large gaps, where FIG. 18a represents 2 μm periodicity, and FIG. 18b represents 1 μm periodicity. Simulation on MPL exposure process with different gaps are illustrated by the plots in FIGS. 18c and 18d, with FIG. 18c being 0 µm, and FIG. 18d being 10 µm. This separation, or gap, can vary significantly when the weight is not applied especially if a rigid substrate and mask are used. FIGS. 18a and 18b show different locations of the sample patterned without the weight. Both the size of the disks as well as the periodicity change in regions of the sample that are not in good contact. The doubling of the periodicity can be attributed to an effect known as the Talbot effect. This is a diffractive effect that generates repeating patterns including doubling the periodicity of the original grating. A very thick resist layer (e.g., 2-15 µm) may be utilized to realize a pattern in the resist that is defined by the Talbot effect. The developed photoresist (i.e., after removal of the exposed or unexposed photoresist depending upon the type), should have the Talbot effect pattern (e.g., lattice), which may then be used to form a corresponding nanoantenna array structure. The gap used to pattern FIG. 18b agrees with a frequency-domain FEM simulation (ANSYS Electronics 18.2) of a 10 µm separation between the microspheres and photoresist. This is shown in FIGS. 18c and 18d, which plot the simulated magnitude of the normalized energy in the electric field 240 nm from the surface of the photoresist (midplane) for gaps of 0 and 10 µm, respectively. While the doubling of the periodicity can be advantageous, maintaining a 10 µm gap precisely over a large area requires optically flat surfaces and significantly raises the expense of the fabrication process. The objective becomes minimizing the gap so that the exposure is directly from the photonic jets. This must be accomplished without excessive pressure leads to wear of the mask, specifically the transfer of microspheres from the tape to the photoresist.

Figure 19:
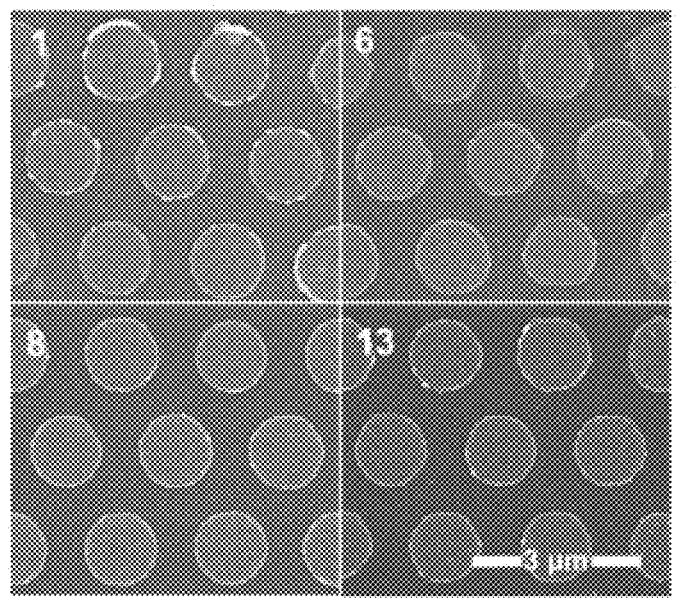
FIG. 19 shows SEM images of various experimental samples.

FIG. 19 shows SEM images of various samples. Thirteen samples were created with the same tape mask. E-beam evaporation was used to deposit a 150 nm of aluminum onto the polyimide substrate. A 200 nm thick layer of silicon is evaporated on top of the aluminum without breaking vacuum. The photoresist is then spin coated on top of the silicon and exposed using the microsphere mask using a consistent fluence of 62.5 mJ/cm². The lift-off procedure was used to pattern the disks on the silicon layer. FIG. 19 shows SEM images of samples 1, 6, 8 and 13.

Figure 20:
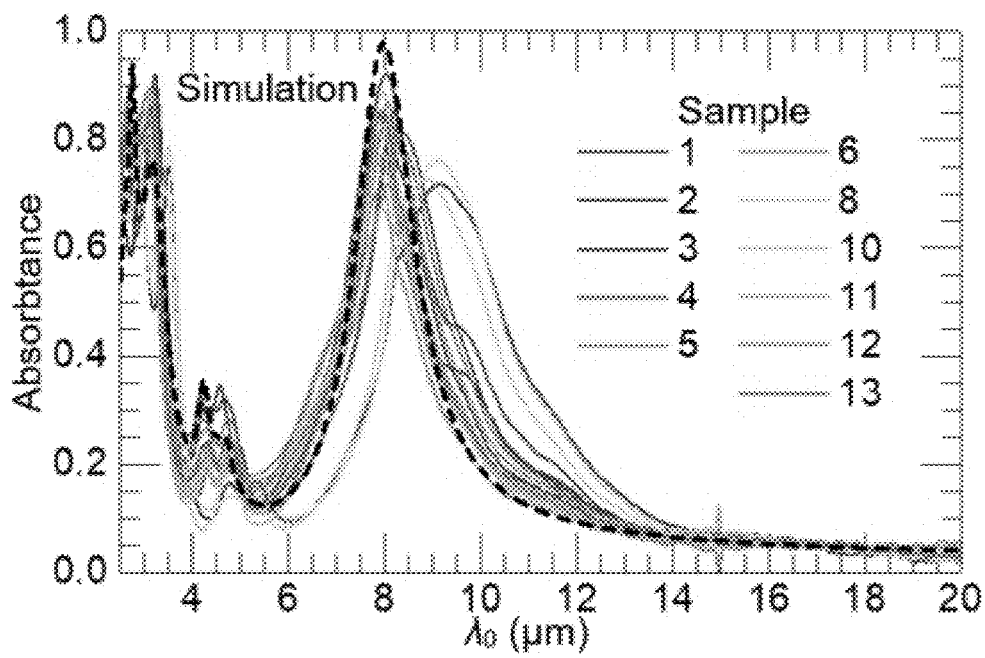
FIG. 20 illustrates an absorbtance plot generated in connection with the samples according to FIG. 19.

FIG. 20 illustrates a plot generated in connection with the samples described above in connection with FIG. 19, where measured absorptance for different metasurfaces patterned with a common microsphere mask is plotted, and a simulated absorptance is plotted with a dashed line. The absorption spectra of the samples were measured using FTIR (Thermo-Nicolet, Nexus 670). A VeeMAX accessory (Pike) was used to measure the reflectance spectra from the samples over a 9.5 mm diameter aperture from 30° off-normal incidence. The reflectance is normalized to the reflectance from a gold mirror. Because there is no transmission through the aluminum ground plane, the absorptance, $\alpha$, can be calculated from the reflectance, $\rho$, $\alpha(\lambda)=1-\rho(\lambda)$. FIG. 20 shows the absorptance spectra from 11 of the 13 samples (all exposed using the same mask). A polarization averaged ANSYS simulation of the metasurface is also plotted (dashed lines) and was designed for resonance at $\lambda=8$ µm. At this wavelength and angle of incidence the simulated absorptance is $\alpha=0.98$.

Figure 21A:
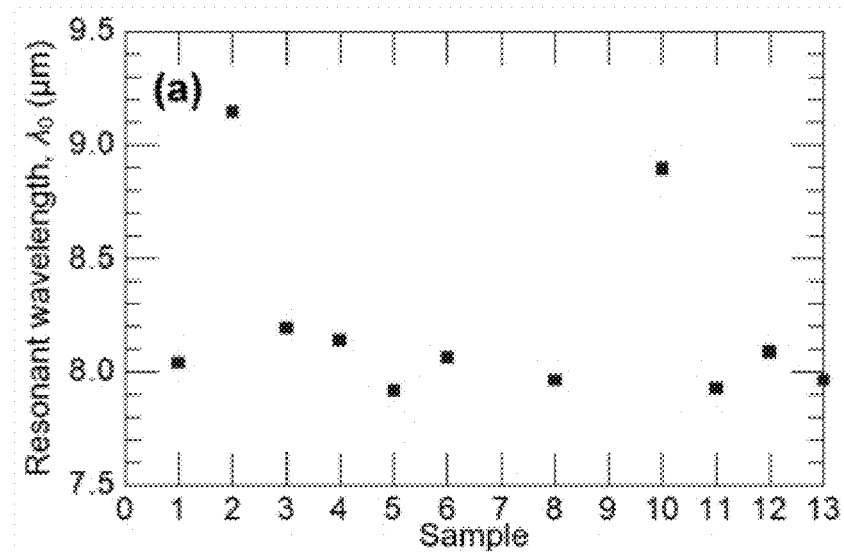
FIGS. 21a and 21b illustrate plots of resonant properties of samples according to FIG. 19.
Figure 21B:
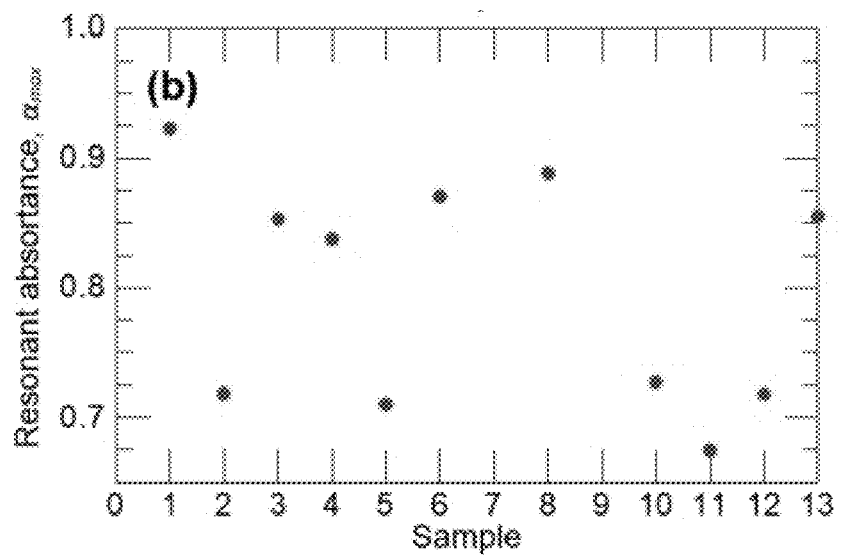

FIGS. 21a and 21b illustrate properties of the different samples with respect to resonant wavelength (FIG. 21a) and resonant absorptance (FIG. 21b). After removing the outliers of Samples 2 and 10, the mean resonant wavelength for the remaining 9 samples is $\lambda=7.99$ µm with a standard deviation of 0.09 µm and a mean resonant absorptance of $\alpha=0.81$ with a standard deviation of 0.07.

The results shown in FIGS. 19-21 illustrate the feasibility of the process. The good agreement of the resonant wavelength shows good uniformity in the disk diameters. This indicates that the gap is well controlled. However, the absorptance is significantly lower than the value predicted by simulation, suggesting that the metasurface does not cover the entire aperture. Gaps in the metasurface occur due to defects into the microsphere mask are transferred to the metasurface, which can be caused by the self-assembly process which results in a polycrystalline HCP array. At the boundaries between the grains, the physical contact can cause the loss of microspheres (transferred to the photoresist). Improvements in the microsphere deposition process can potentially improve the process. This is limited by the variance in the size of the microspheres (~2% for commercial silica microspheres). These microspheres can nucleate multilayer defects in the lattice. Control of the contact forces is critical for the process. Using a flexible substrate allows conformal contact and lowers the force required to minimize the gap between the microspheres and the photoresist, although the mask technique can be used in conjunction with surfaces of an optical fiber. The adhesive force provided by the tape is also significant in maintaining the microspheres on the mask. Thus, the ability of creating multi centimeter sized periodic microstructures was realized using mask-based microsphere photolithography. Simulation and experiment show that minimizing the gap is critical for consistent performance. The repeatability of the technique using a simple weight system and flexible substrate is evaluated in the context of an infrared metasurface absorber. This is sufficient for uniform contact over cm² areas. A tape based microsphere mask was re-used over 13 times and produces minimal deviations in the resonant wavelength and maximum absorptance.

Figures 22A, 22B, 22C:
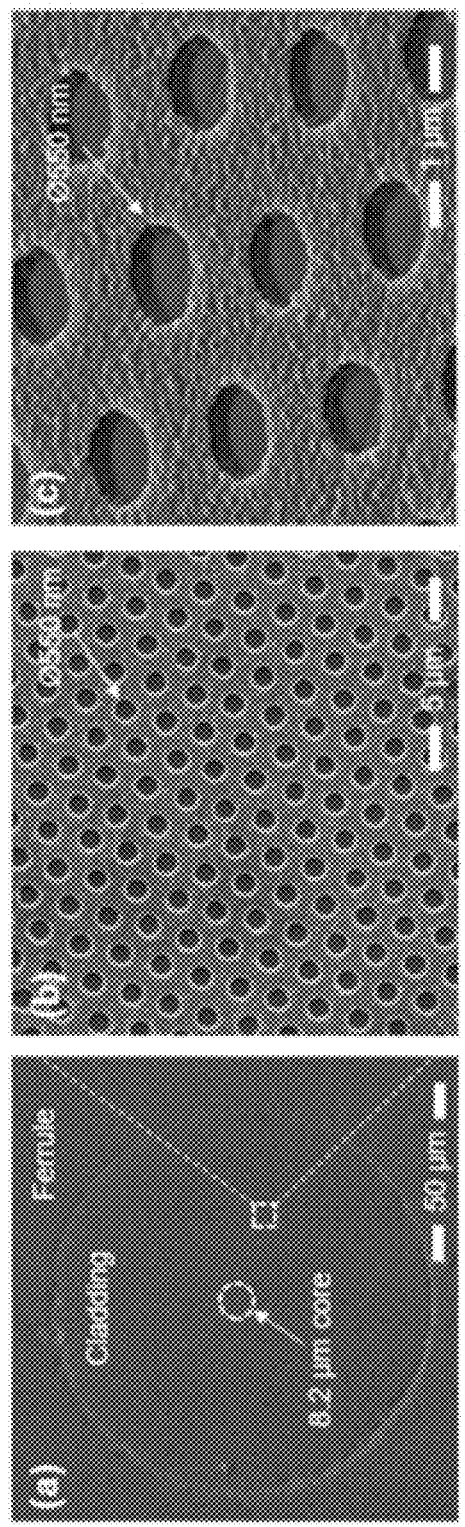
FIGS. 22a to 22c show SEM images of an experimental hole-patterned optical fiber tip.

In connection with the above-described example of a fiber with an 8.2 µm diameter core and a 125 µm diameter cladding, FIGS. 22a to 22c show SEM images of the tip of the optical fiber patterned with an aluminum hole array. FIG. 22a shows the fiber in the ferrule, FIG. 22b shows a close-up of FIG. 22a, and FIG. 22c shows a tilted image of the individual holes (diameter=550 nm).

Figure 23:
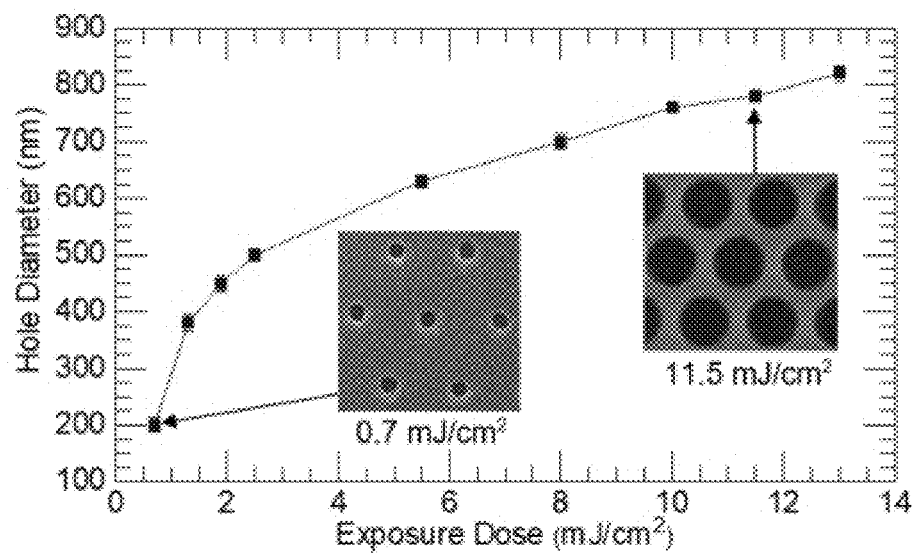
FIG. 23 shows SEM images and illustrates a plot showing the relationship between hole diameter and exposure dose.

FIG. 23 shows SEM images and illustrates a plot showing the relationship between hole diameter and exposure dose. The amount of UV exposure affects pattern size. Aluminum holes were obtained by etching, and for holes of diameter less than 500 nm, a thinner photoresist (120 nm) and less developing time (7 seconds) were used. FIG. 23 shows this dependence for a 50 nm thick Al film deposited and patterned on the fiber tip. The photoresist was thinned with PGMEA and spun to a thickness of 120 nm. MPL was performed using periodicity p=1 µm microspheres and the photoresist was developed for 7 seconds. The diameter of the holes is very sensitive to small changes in the dose at the low exposures doses required to create smaller holes. This sensitivity is lower for larger holes. Representative SEM micrographs are shown in the inset with a periodicity (determined by the microsphere diameters) of 1 µm.

Figure 24:
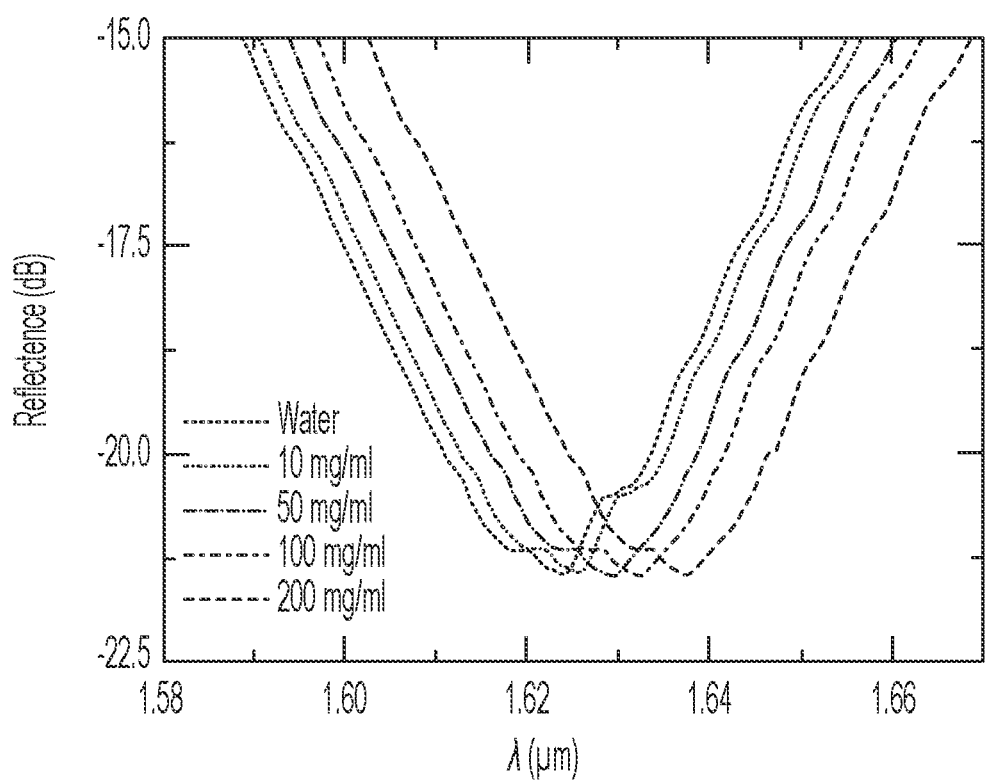
FIG. 24 illustrates a plot of reflection spectra recorded in water and different concentrations of glucose in water.

In connection with FIGS. 22 and 23, FIG. 24 illustrates a plot of reflection spectra recorded in water and different concentrations of glucose in water. FIG. 24 shows the reflection spectra measured from various concentrations of glucose in water. There is a minimum dip in the reflection at $\lambda=1.62$ µm for pure water. As the concentration increases the reflection minima is red shifted. The refractive index was calculated according to the linear relationship between glucose concentration and refractive index. Temperature effect was also evaluated, using a three hole single mode fiber. The concentration of the glucose was kept constant at 10 mg/ml while heating the glucose solution starting from room temperature to 50 Celsius degree with 5 degree increments. It was found that the refractive index of the glucose solution decreases with temperature, which means the wavelength shift decreases when temperature increases, although the influence from the temperature is very small.

In addition to real-world experimental testing, modeling and simulation was performed. This includes, for example, modelling by ANSYS frequency-domain finite element method (HFSS) software. Infinitely periodic boundary conditions were used to model the array which neglects any truncation effects at defects or at the edge of the core. The structures were excited with a plane wave which is justified due to the low numerical aperture (NA) of single-mode optical fiber. HFSS was employed to investigate the coupled modes stimulated by a plane wave propagating through the HCP hole array at the end-facet of optical fiber. Additionally, a 3D hexagonal model was built as unit cell and periodic boundary conditions were applied at side walls assuming the hole array expanded to infinity at the interface.

Figure 25:
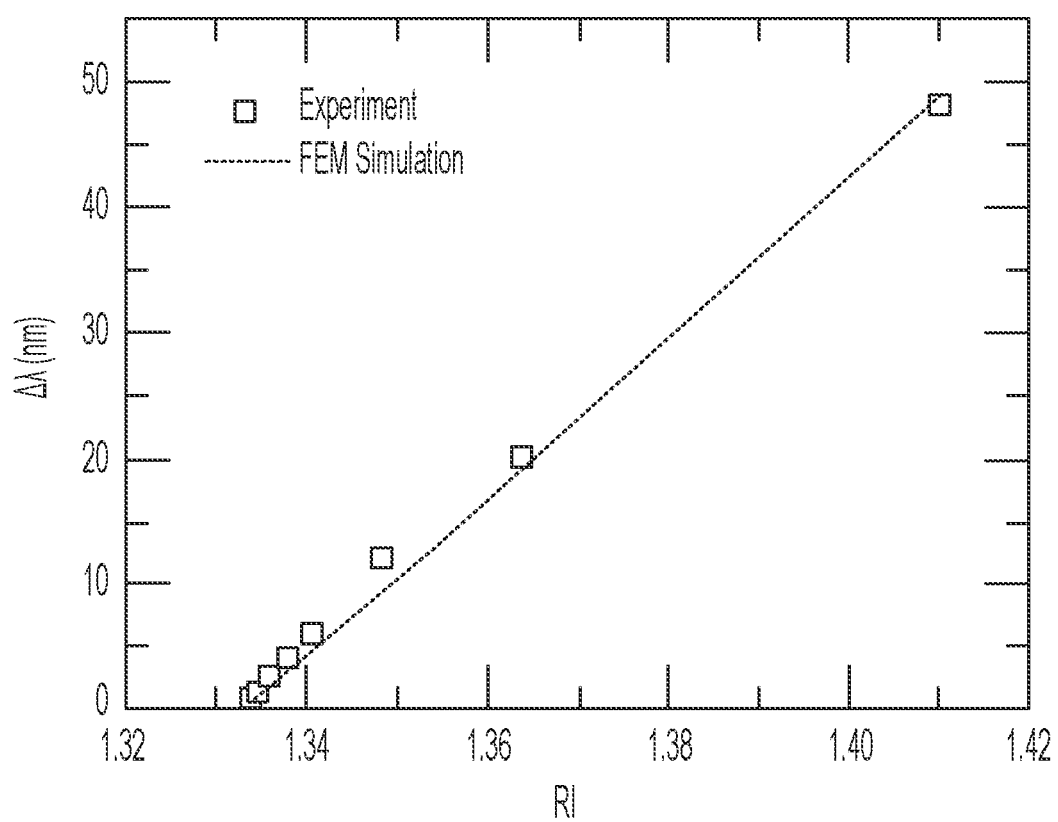
FIG. 25 illustrates a plot of a comparison of sensitivity from experiment and simulation.

FIG. 25 illustrates a plot of a comparison of sensitivity from experiment and simulation for hole size d=700 nm and metal thickness t=50 nm, in connection with FIGS. 22-24. FIG. 25 shows the red shift of the resonant dip vs. refractive index of glucose solution both from experiment and simulation. The resonant wavelength shifted for 48 nm as RI changed from 1.3328 to 1.4101. Using linear fitting, a sensitivity of 613 nm/RIU is achieved from the experiment for d=650 nm and t=50 nm sensor, which is on par with the prediction from simulation (632 nm/RIU) for the same design parameters. The results demonstrate that the guided mode capable of RI detection with relatively high sensitivity. The small discrepancy between simulation and experiment also indicates that the defects from MPL has no significant influence on the performance of the sensor, likely due to the utilization of guided-mode instead of diffracted mode for detection. With the present MPL patterning technique, fabrication of a nanohole resonator on the Al layer coated on the end-facet of optical fiber was achieved. The waveguide mode coupled with the LSPR mode provided the ability for refractive index detection. A sensitivity of 613 nm/RIU was achieved on glucose solution, matched well with simulation results, thus showing the feasibility of MPL as a low-cost defect-free method to fabricate the optical fiber refractive index sensor.

Figure 26A:
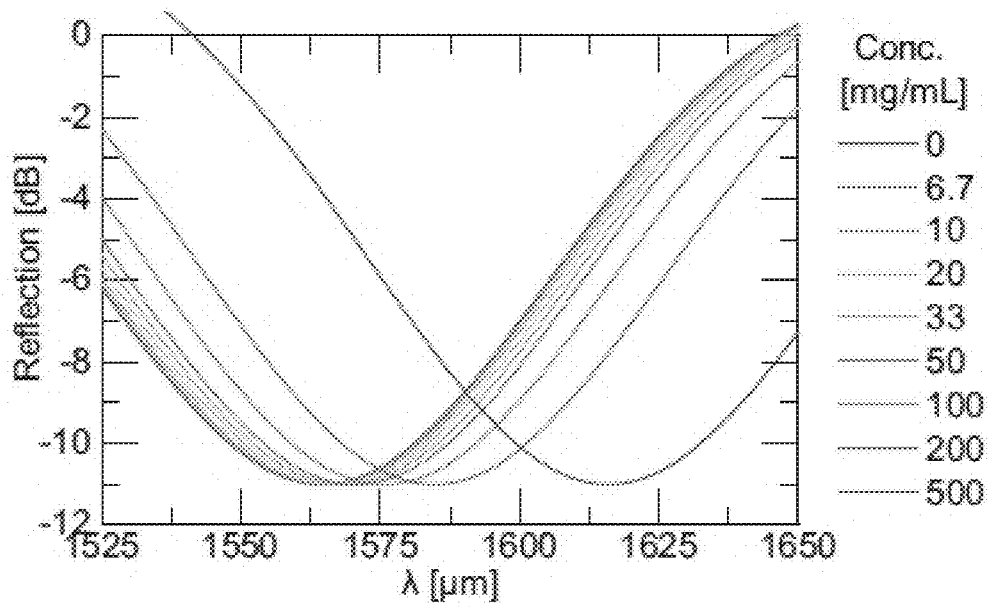
FIGS. 26a and 26b illustrate plots of reflectance spectrum resulting from sugar-water tests.
Figure 26B:
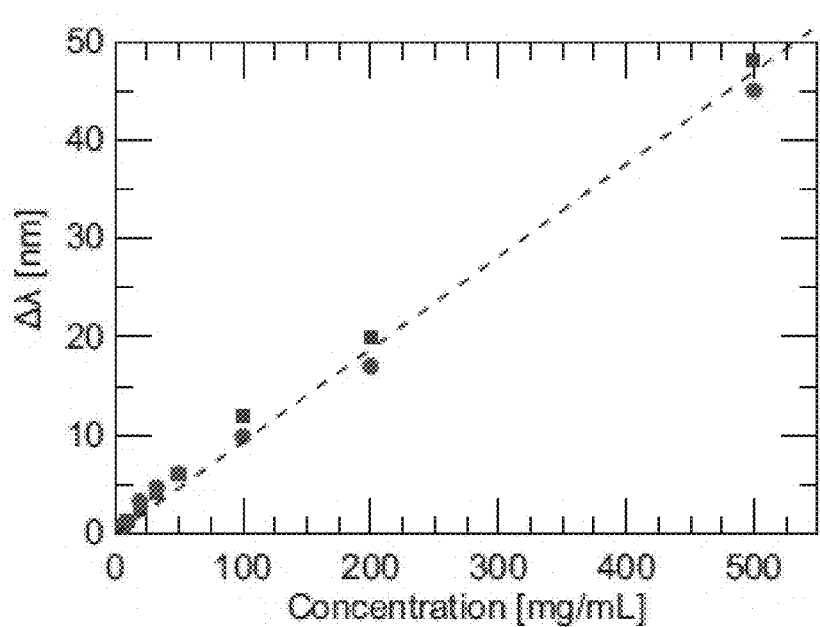

Referring back to FIGS. 15a to 15c, frequency-domain finite element simulations predict peak transmission at a resonant mode resulting from the combination of a surface plasmon polariton (SPP) hybridized Rayleigh-Wood anomaly with waveguide modes in the holes. This resonant mode is sensitive to the refractive index of the media surrounding the holes and corresponds to a minimum in the reflectance spectrum for light propagating along the fiber. FIGS. 26a and 26b show the reflectance spectrum from a fiber probe with 600 nm diameter holes immersed in different concentrations of sugar-water. The measured sensitivity of the probes was 0.12 nm per mg/mL.

Figure 27A:
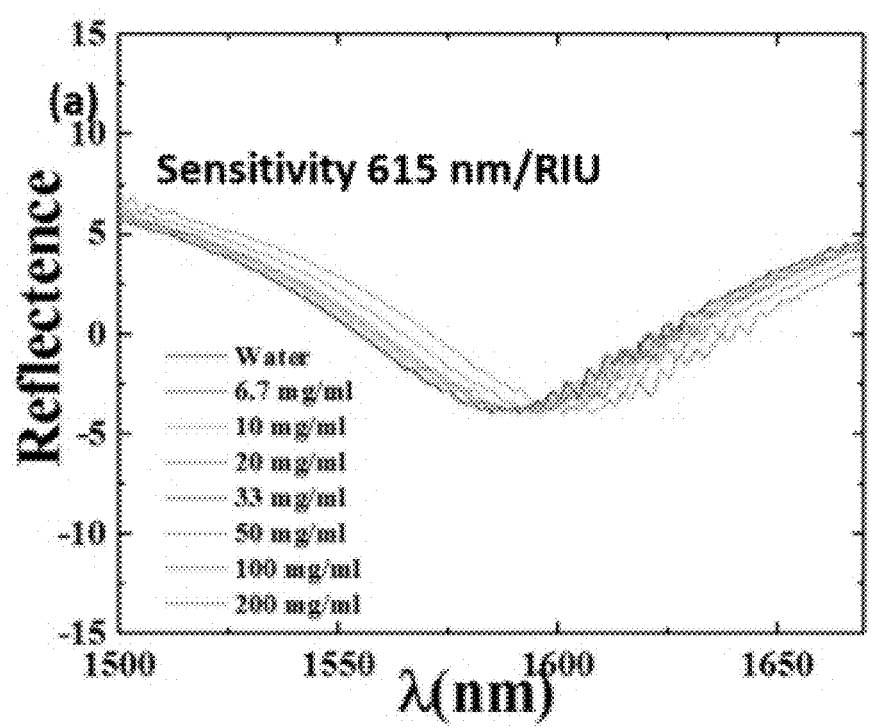
FIGS. 27a and 27b illustrate plots regarding sensitivity of samples used in glucose testing.
Figure 27B:
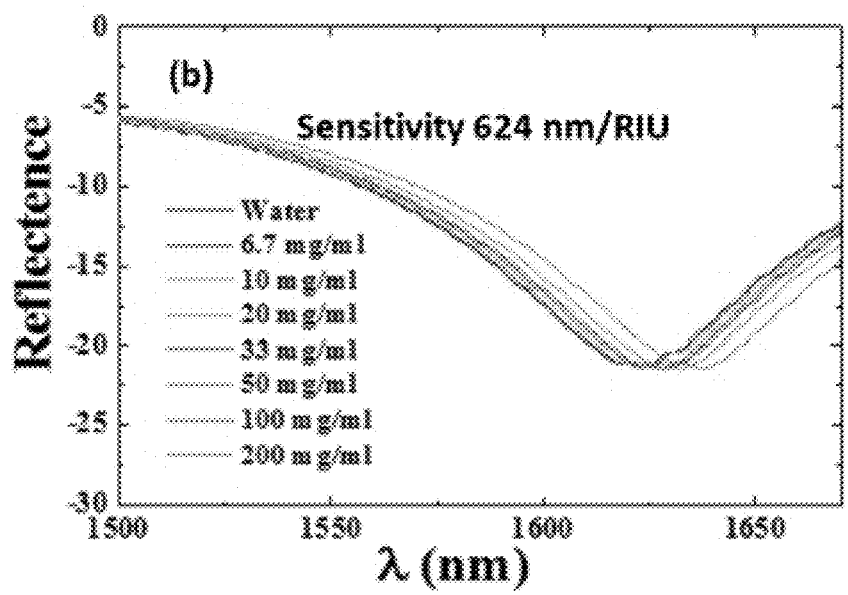
Figure 28A:
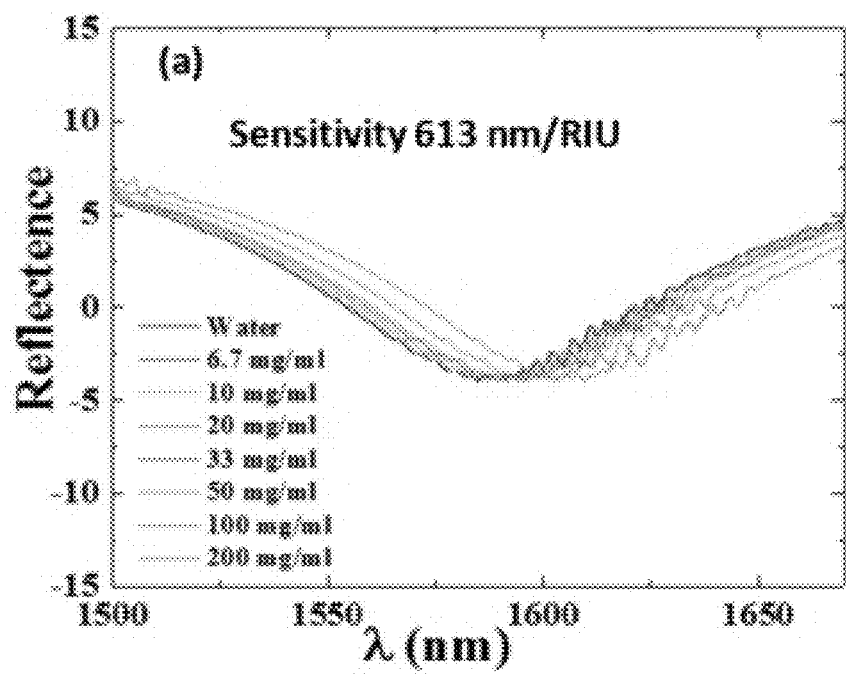
FIGS. 28a and 28b illustrate plots regarding sensitivity of samples used in salt testing.
Figure 28B:
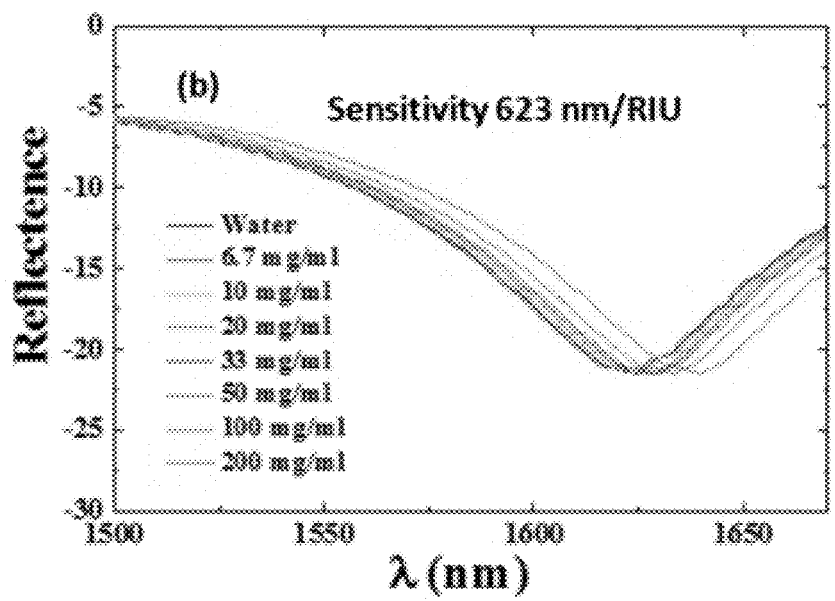

Referring back to FIG. 11, FIGS. 27a and 27b illustrate plots regarding sensitivity of different fibers. FIG. 27a shows a first fiber (500 nm) and FIG. 27b shows a second fiber (650 nm) that have the pattern of single hole for glucose testing (e.g., two tested samples in different concentrations of glucose in water). The optical sensitivity is 570 RIU/nm. The detection limit was found to be around 10 mg/ml. The results show a linear shift of resonant wavelength with the increase of the tested solutions. The results indicate that the shift in resonant wavelength for glucose solution is slightly less than the shift in resonant wavelength for salt solution for the same concentration. This is because the refractive index for salt solution is little bit higher than the refractive index for glucose solution for the same concentration. FIGS. 28a and 28b illustrate plots regarding sensitivity of tested samples in salt water. Two different fibers (Fiber 1, FIG. 28a and Fiber 2, FIG. 28b) have the pattern of single hole for salt testing. The optical sensitivity is around 624-660 RIU/nm. The detection limit was around 10 mg/ml. Sensitivities were evaluated over a range of configurations for glucose and salt water solutions.

Figure 29A:
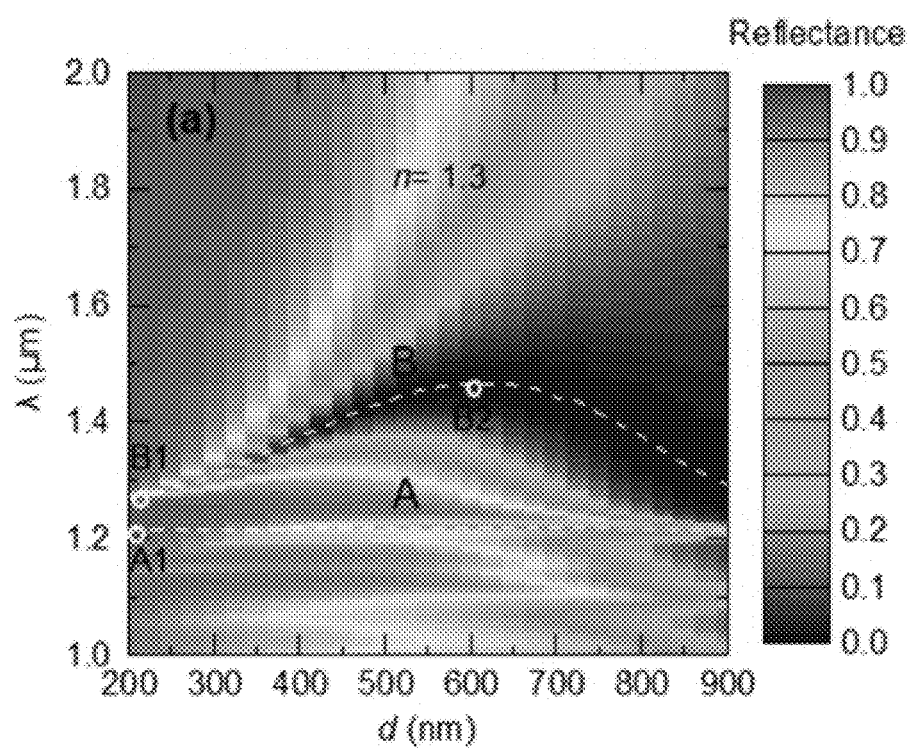
FIGS. 29a to 29f illustrate reflection spectra for a hole array simulation.
Figures 29B, 29C, 29D:
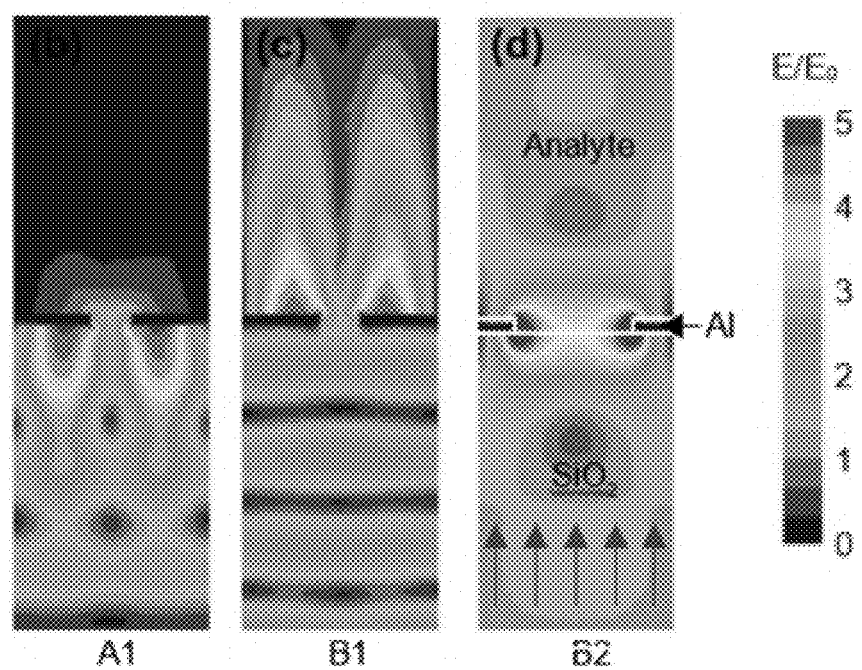
Figure 29E:
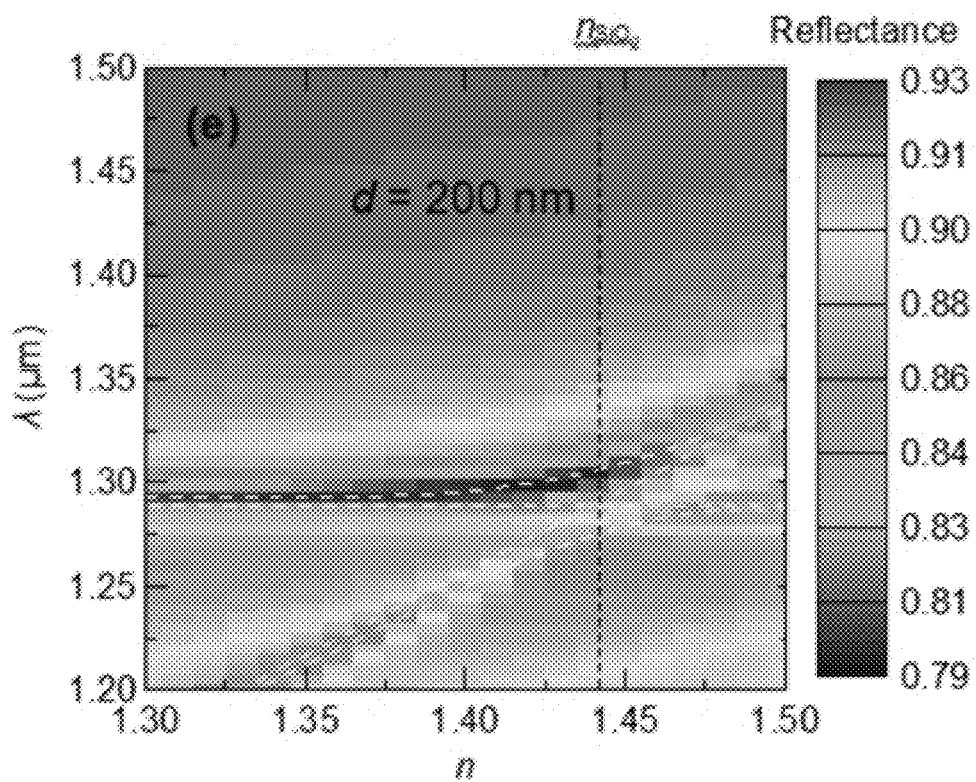
Figure 29F:
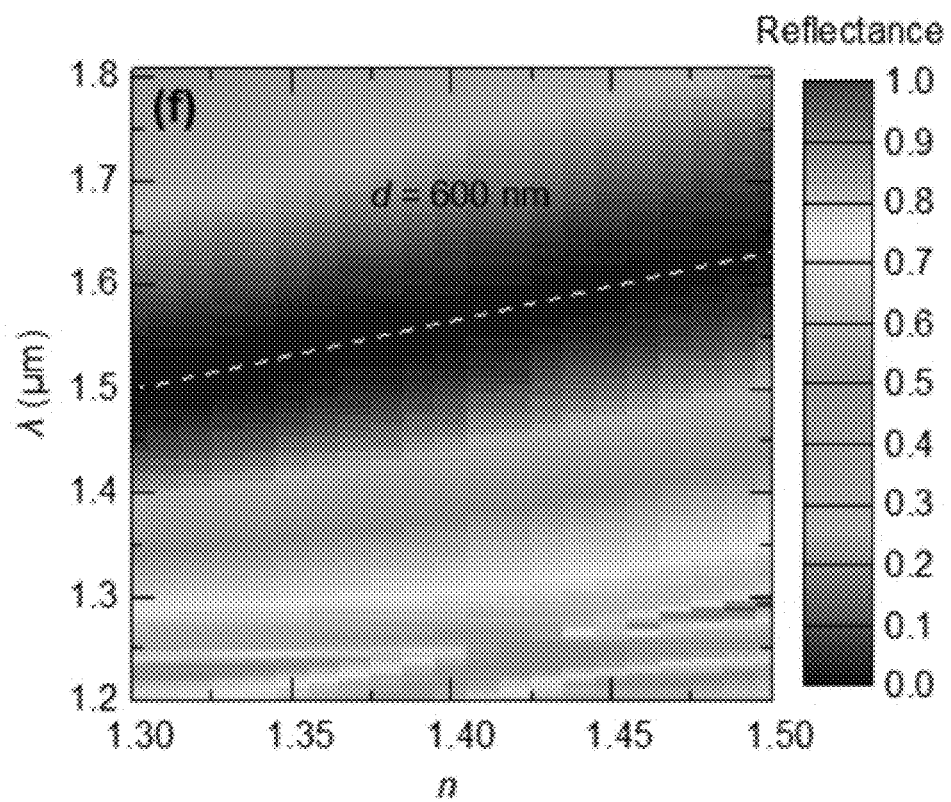

FIGS. 29a to 29f illustrate the reflection spectra for the HCP hole array on a 50 nm thick Al layer with diameter varying from 200 to 900 nm. The simulation was performed with an environmental RI of 1.3. Two modes within 1.2 to 1.7 µm wavelength range are usable for the detection of RI change. Frequency domain finite element method (FEM) simulation (Ansys HFSS) was used to model an infinitely periodic HCP hole array at the end-facet of optical fiber. A plane wave excitation was used due to low numerical aperture (NA) of SMF. Constrained by the present MPL fabrication technique, the periodicity was set to be 1 µm, corresponding to the diameter of the microsphere used. The hole diameter was simulated from 200 to 900 nm and the thickness of the Al layer from 25 nm to 125 nm. FIG. 29a shows the reflection spectra for the HCP hole array on 50 nm thick Al layer with diameter vary from 200 to 900 nm. The simulation was performed with an environmental RI of 1.3. Two modes within 1.2 to 1.7 µm wavelength range could be potentially used for the detection of RI change. These two modes behave quite different with diameter changes, marked with A and B. Mode A keeps the same resonant wavelength regardless of hole diameter but mode B has a redshift on the resonant dip for small holes and blue shift for large holes. Note the bandwidth increases dramatically for mode B due to less selectivity on the frequency for larger holes. To identify those modes and their ability to RI detection, three points are selected, with two at d=200 nm, and one at d=600 nm, marked with A1, B1 and B2 in FIGS. 29b to 29d, respectively, where the electric fields are shown. Mode A1 and B1 were identified from E-field distribution to be LSPR mode stimulated at metal/SiO$_2$ interface and metal/analyte interface respectively, shown in FIGS. 29b and 29c. With illumination coming from the bottom, E-filed was concentrated on the upper/lower metal/dielectric interface, having an exponential decay perpendicular from the interface. FIG. 29e shows how these two modes behave as RI varied from 1.3 to 1.5 for d=200 nm. The mode resonates near 1.3 µm corresponding to mode B1 in FIG. 29c while the other mode resonates near 1.2 µm corresponding to mode A1 in FIG. 29b. As n increases, the LSPR mode stimulated at metal/analyte interface shifts toward the long-wavelength while the other LSPR mode stays the same resonant wavelength because little field penetrating the analyte. Rabi-splitting type anti-crossing can be observed as n of analyte approaching the refractive index of SiO$_2$ which is around 1.44. The LSPR mode may be used to stimulate a metal/analyte interface for RI detection except for the anti-crossing wavelength range, at sensitivity around 500 nm/RIU from simulation. For d=600 nm (FIG. 29f), mode B2 (FIG. 29d) is no longer pure LSPR mode as what has been seen in mode B1. FIG. 29d shows the E-field of mode B2 was concentrated inside the hole indicating the dominance of TE11 guided-mode. FIG. 29f shows how does resonance shift with respect to RI changes. The anti-crossing effect was even stronger and coupled to TE11 guided mode. This mode could also provide sensitivity comparable to LSPR mode for d=200 nm case around 500 nm/RIU. Beyond that, the coupling mode also greatly increased the amplitude of spectral peaks. Notice the near-zero reflection was shown for the coupling mode in FIG. 29f while a minimum of only 80% reflection was shown in FIG. 29e. The downside of this coupling was the broadening of the resonant peak that will compromise the FOM of the sensor. However, it's still worthwhile to use the coupling mode for RI detection due to its ability to control the performance of the sensor by engineering the geometric parameters and to potentially provide higher sensitivity over 600 nm/RIU.

Figure 30A:
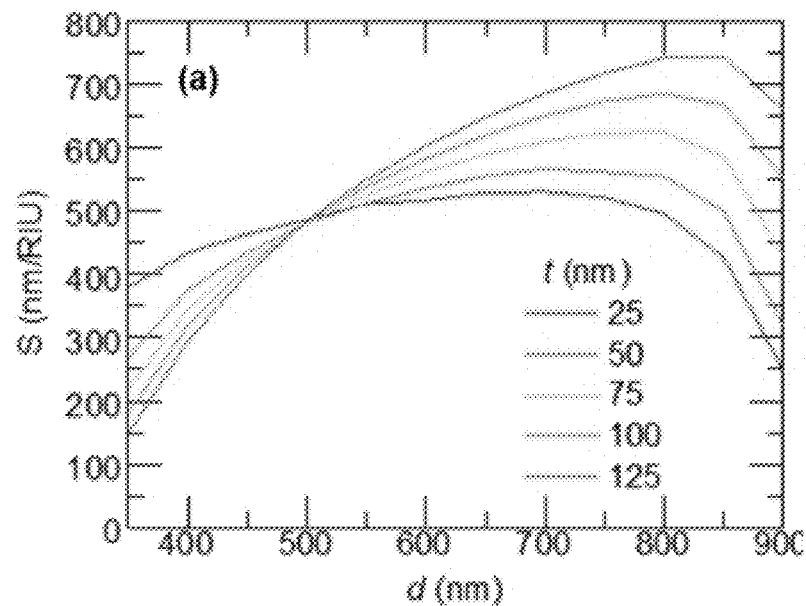
FIGS. 30a and 30b illustrate plots of sensitivity and figure of merit properties of a sensor fabricated with MPL techniques.
Figure 30B:
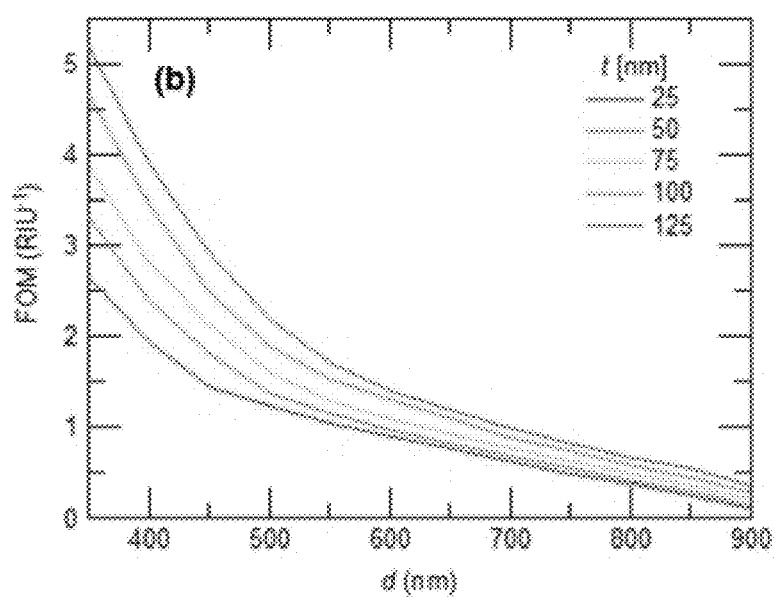

Another important issue that needed to be addressed was how the geometric parameters impact the characteristics (such as sensitivity and FOM) of the sensor. Three geometric parameters in the configuration were considered could influence the performance of the sensor: the diameter of the hole, d; the thickness of the metallic layer, t; and the periodicity of the hole array, p. Unfortunately, the periodicity of the hole array only depends on the diameter of the self-assembled microsphere in the MPL process. These parameters cannot be easily tuned to any desired value during the fabrication process. Thus, consideration is focused on the other two parameters: d and t. To evaluate the sensor performance, the sensitivity S and the FOM was examined with different d and t, shown in FIGS. 30a and 30b. FIG. 30a illustrates S compared to diameter d and thickness t, and FIG. 30b illustrates the effect of d and t on the FOM of the sensor. Generally, the FOM decreases as d increases regardless of t. But increasing the thickness will be favored to have large FOM. The FOM is related to sensitivity and FWHM according to its definition (defined earlier). As indicated in FIG. 30a, large FWHM is observed for large d. Consequently, even with large sensitivity for large holes, the FWHM still is the dominant factor for FOM, resulting in a continuous drop. On the other hand, a thicker metallic layer presents narrower resonant bandwidth accompanied by a tiny blue shift of the resonant wavelength. From a practical point of view, although the thick metallic layer will bring large sensitivity with large FOM, the sharper S vs. d curve indicates there will be a larger uncertainty of sensitivity with the same fabrication tolerance of d. A moderate thickness with an appropriate hole diameter would be more reasonable for cost-performance balancing.

The simulation results reveal how the geometric parameters of the cavity would influence the performance of the sensor and the ability of the present MPL fabrication technique could control these features if taken one step further. However, the simulation results were acquired based on the infinity hole array assumption. The real sensor only has a limited number of holes on the fiber core. Deferent spheres orientations could also be introduced through the self-assembly process which potentially influence the resonance wavelength location.

Further regarding SERS, Raman spectroscopy is a technique typically used to determine vibrational modes of molecules which can be used in chemistry to provide a structural fingerprint by which a medium can be identified. Raman signals are weak, leading to a low number of scattered photons are available for detection. One method to magnify the weak Raman signals is to employ SERS, which uses nanoscale metal surfaces typically made of gold (Au). In testing of the present techniques described herein, microspheres of 1 μm and/or 1.5 μm were used, with nano disks being fabricated (e.g., using a lift-off or electroplating process) for SERS testing. The metal layer comprises gold with height/thickness of 100 nm. R6G dye in solution was used to test the fabricated samples. Results exhibited a strong SERS signal for the various (e.g., 4) disks pattern, tested in small concentrations of the R6G solution. The smallest detected concentration of R6G was $10^{-8}$ gr/ml.

Figures 31A, 31B, 31C, 31D:
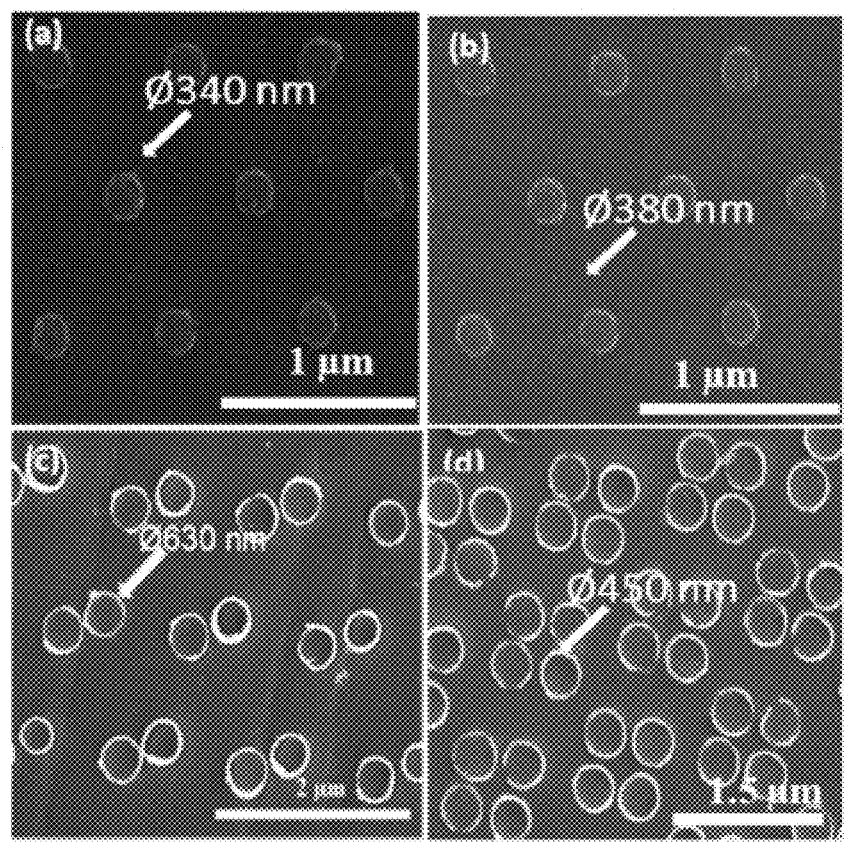
FIGS. 31a to 31d show SEM images of disk patterning on an optical fiber tip used for SERS testing.

FIGS. 31a to 31d show SEM images of patterning on a fiber tip used for the SERS testing. FIGS. 31a and 31b show a single disk, but with different pattern dimensions. FIG. 31c shows two disks: fixing φ for 30 degree, and exposing the photoresist mold when θ=0, 180. Then aluminum (Al) deposition was done to create the pattern. FIG. 31d shows four disks: fixing φ for 30 degree, and exposing the photoresist mold when θ=0, 90, 180 and 270. Then Al deposition was done to create the pattern. The patterns of FIGS. 31a and 31b are from 1 μm spheres, the pattern of FIG. 31c is from 2 μm spheres, and the pattern of FIG. 31d is from 1.5 μm spheres. All SERS testing was done using disk pattern techniques, which is different from the hole pattern techniques used for plasmonic testing. The fiber probes were tested in 1-μM R6G dye, which is often used as a tracer dye (described above) within water to determine the rate and direction of flow and transport (SERS spectrum for this solution is well known and typically used as reference spectrum). The light response from the gold disks matches the published literature results for the tested 1-μM R6G where the tested fiber shows peaks at the same frequency regions.

In the SERS experiments, a laser light source (532 nm) was used to feed the light, as well as a multimode light coupler and light detector. Using the disks pattern on a 62 μm core diameter multimode fiber, the fibers were tested for SERS, using spheres to create different diameters of disks pattern using single exposure on the fiber tip. The material of the disks is gold with 100 nm thickness. The same fabrication method used to create the holes used to create the disks except that the photoresist patterned on a clean bare fiber followed by gold metal deposition. The last step in fabrication was the removal (e.g., lift off) of the photoresist.

Figure 32:
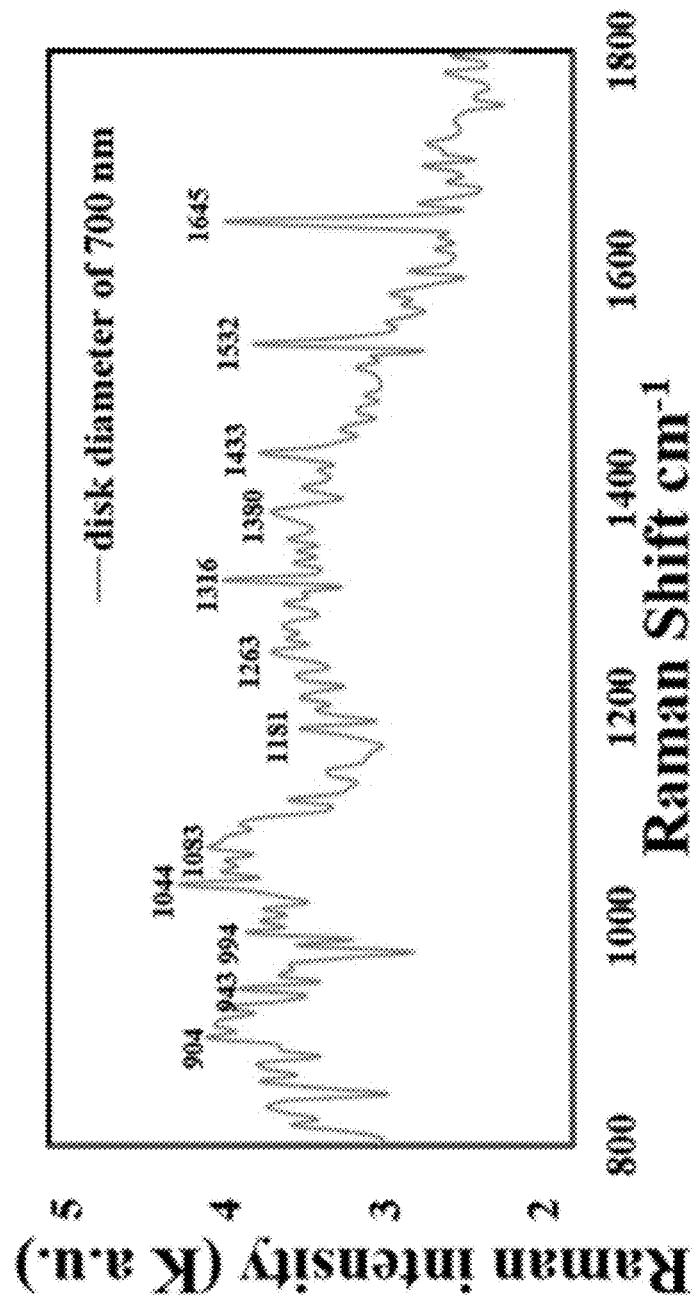
FIG. 32 illustrates a plot of results of SERS signals when the background spectrum from a bare fiber was removed.
Figure 33:
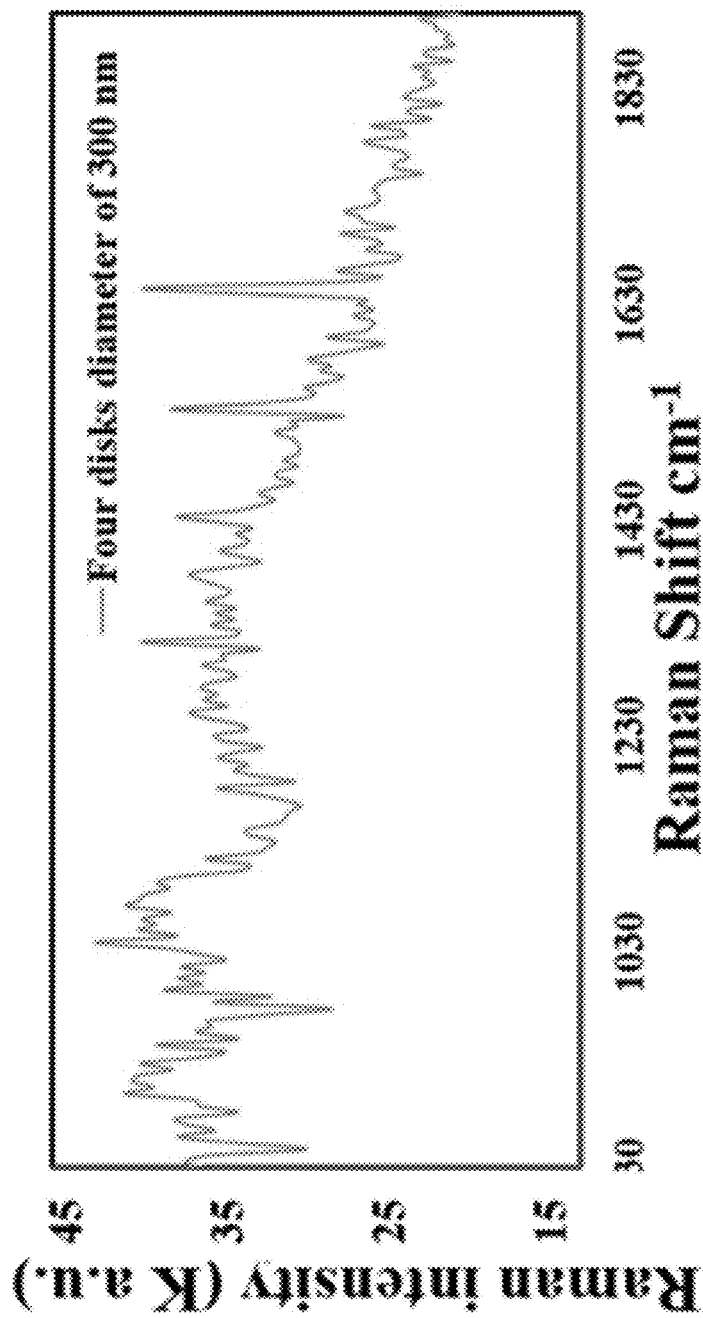
FIG. 33 illustrates a plot of results of SERS signals when the background spectrum from a bare fiber was removed.
Figure 34:
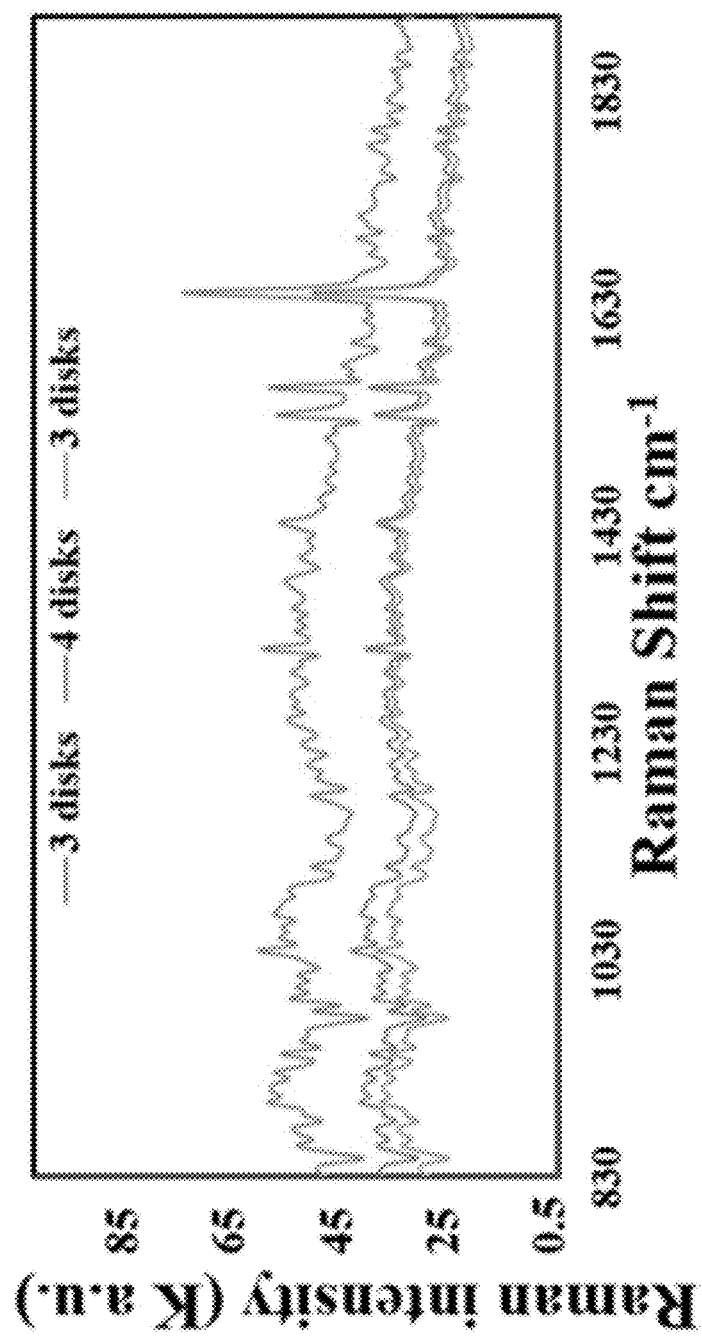
FIG. 34 illustrates a plot of a comparison between the SERS signals for a 3 disks pattern and a 4 disks pattern.
Figure 35:
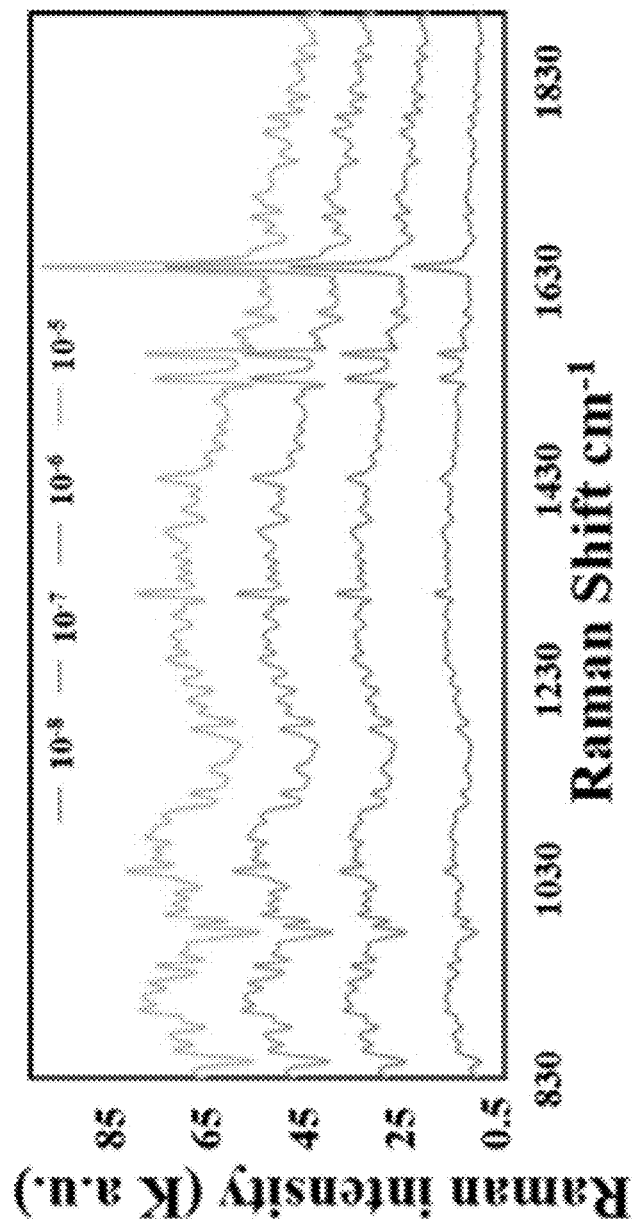
FIG. 35 illustrates a plot of SERS signals for a 4 disks pattern tested in different concentrations of R6G.

FIGS. 32-35 illustrate results of the SERS testing. FIG. 32 illustrates results of SERS signals when the background spectrum from a bare fiber was removed. FIG. 33 illustrates results of SERS signals when the background spectrum from a bare fiber was removed. FIG. 34 illustrates a comparison between the SERS signals for a 3 disks pattern and a 4 disks pattern. FIG. 35 illustrates SERS signals for a 4 disks pattern tested in different concentrations of R6G in gr/ml. The patterned fiber samples were soaked in 1-μM R6G for 3 hours before the SERS measurements. FIG. 32 (single disk) and FIG. 33 (four disks) show two samples that have the spectrum obtained from substraction of the background spectrum where the tested species is R6G. Since the background (bare fiber) has been removed, the SERS peaks were much more clear because the background signal saturated the SERS peaks in the spectrum. Also tested was the 3 disk pattern in R6G, compared the results with 4 disks. The 4 disks pattern gave higher intensity than the 3 disks pattern due to having more gold surface area on the fiber tip. FIG. 34 shows a comparison between two samples with 3 disks pattern and one sample with 4 disks pattern tested in R6G. The 4 disks pattern with diameter of each disk equal to 300 nm was tested in different concentrations of R6G, shown in FIG. 35.

Figures 36A, 36B, 36C, 36D, 36E, 36F:
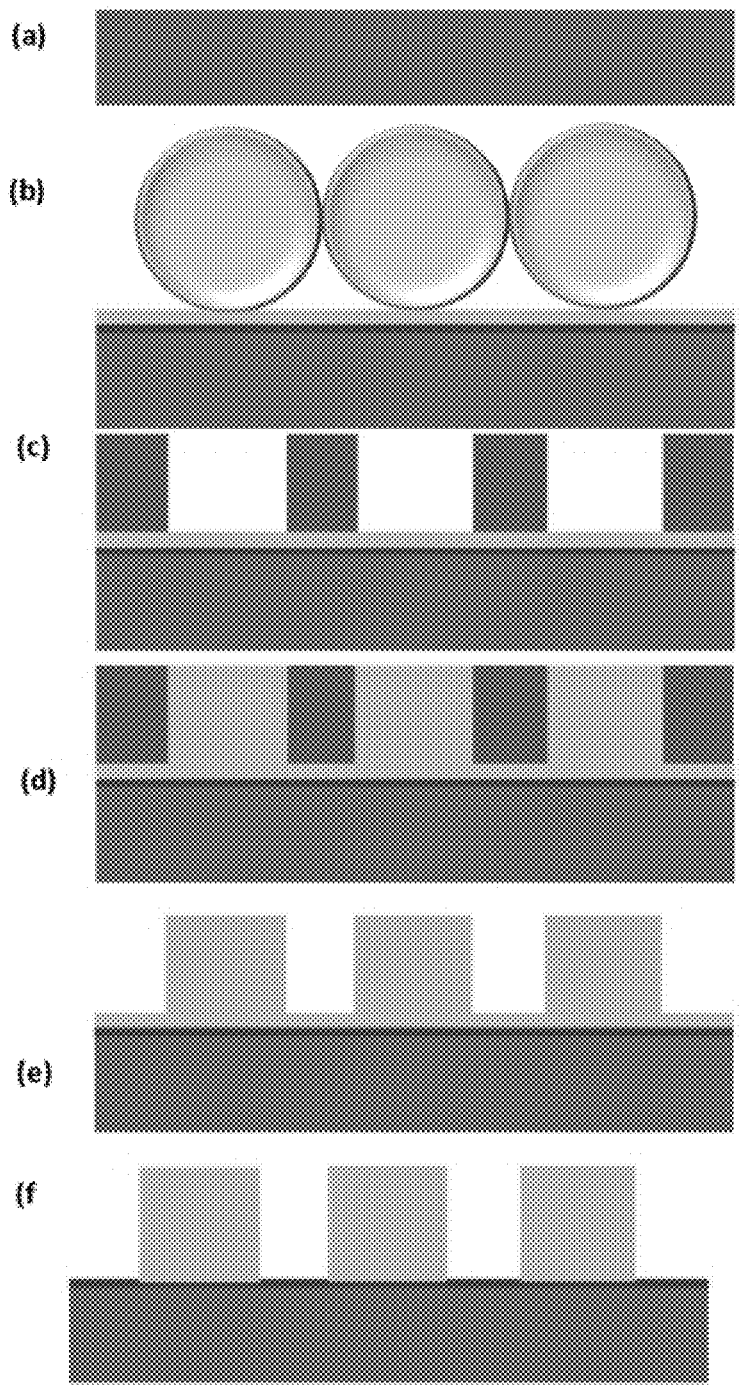
FIGS. 36a to 36f illustrate steps of an electroplating technique.

For structure fabrication in the SERS testing, electroplating may be preferred over a lift off process because it is cheaper and less complicated. FIGS. 36a to 36f illustrate the electroplating technique used (e.g., for the SERS testing), illustrating a side view schematic of the electroplating fabrication steps. FIG. 36a illustrates bare fiber, FIG. 36b illustrates Cr/Au thin film deposition, FIG. 36c illustrates Shipley 1813 photoresist patterning using MPL, FIG. 36d illustrates an electroplating process ran for 3 hours, FIG. 36e illustrates photoresist removal, and FIG. 36f illustrates a final post structure resulting after the above process steps. The fabrication starts by depositing thin layers of Cr/Au with thicknesses of 10 nm and 30 nm respectively. Then, Shipley 1813 positive photoresist was spun coated on the fiber tip with spinning speed of 5000 rpm to create a photoresist layer with thickness of 500 nm. The samples were then baked in over for 40 seconds at 80 degrees. Microspheres assembly was performed next to form a compact layer of spheres on the photoresist layer. The fiber probe was then exposed for 1 second, developed for 30 seconds and washed with deionized (DI) water. Holes with diameter of 550 nm were resulted on the fiber tip. The sample was placed in gold electroplating solution and connected to a current source. A platinum mesh was connected on the counter electrode side.

Figure 37:
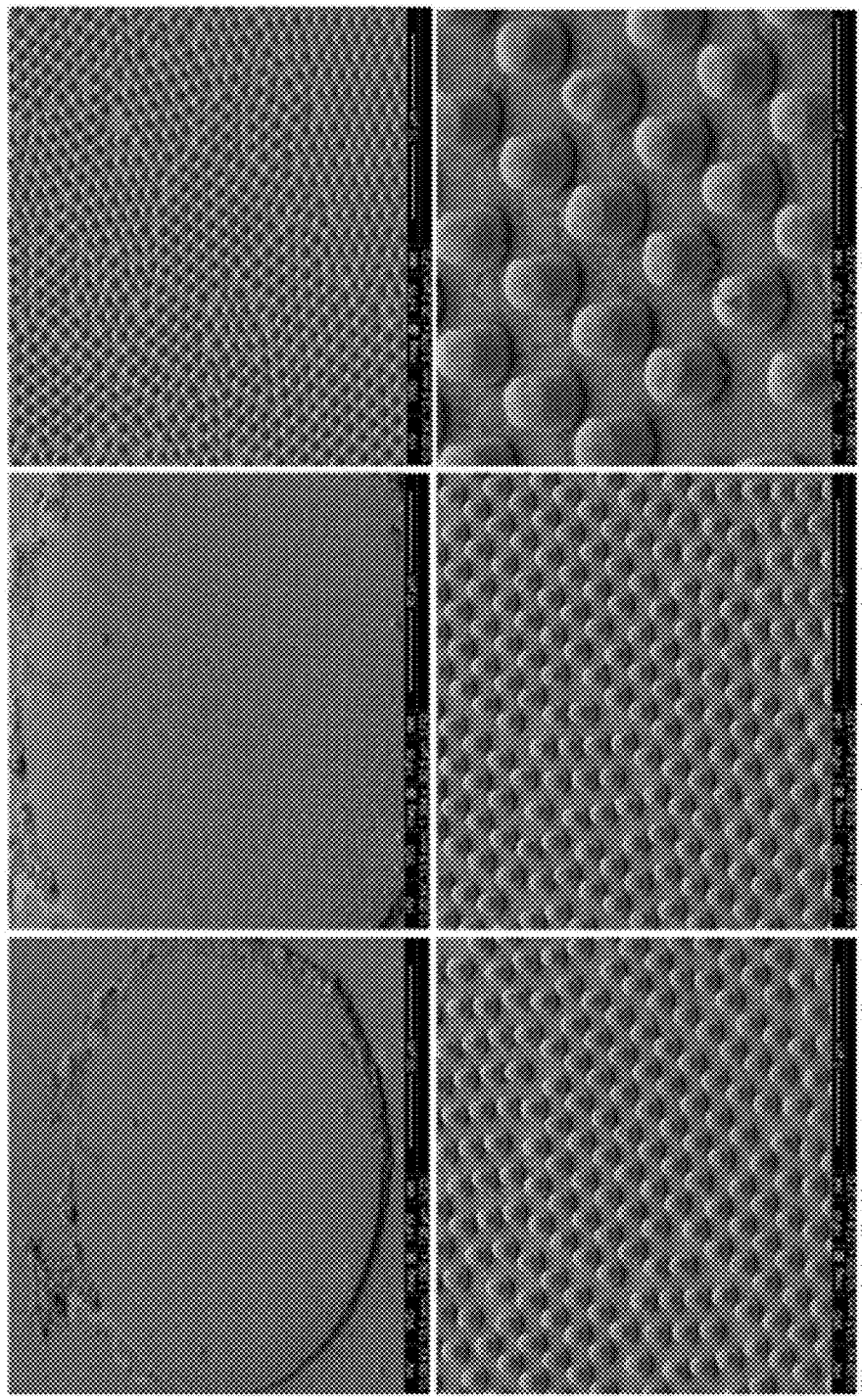
FIG. 37 shows SEM images of a nanopost array made in accordance with the electroplating technique of FIGS. 36a to 36f Reference characters in the written specification indicate corresponding items shown throughout the drawing figures.

FIG. 37 shows SEM images of different levels of magnification of nanopost arrays made in accordance with the process shown in FIGS. 36a to 36f and the above-described electroplating. The nano post array was fabricated as follows: (1) a seed layer made of chromium (Cr) and gold (Au) films were sputter deposited on a glass substrate with thickness of 20 nm and 30 nm, respectively; (2) a thin layer of photoresist (Shipley 1805) was spin coated and soft baked at 90° C. for 1 minute to achieve a thickness of 700 µm; (3) the glass substrate was then placed inside a beaker full of water, followed by injecting 5 µl spheres with diameter of 1 µm in butanol into the water; (4) after the spheres were floated and stabilized on the water surface, the water was slowly drained (this caused the microspheres to self-assemble on top of photoresist to form a hexagonal close-packed (HCP) array); (5) they were then flood illuminated with UV radiation to expose the photoresist and were removed during development to form a photoresist mold (FIG. 21b); (6) Au was electroplated to form the post array. The photoresist was washed away and Au/Cr seed layer was etched to form the nano-pillars. The steps shown in FIGS. 4e to 4h generally approximate the nanopost array formation described in steps (1) to (6) above.

The electroplating process takes 3 hours with used current of 10 µA to fabricate 500 nm thick gold structures. The ability to create intricate patterns on an optical fiber supports the creation of surfaces with engineered resonances for SERS, with the antennas optimized to concentrate the patterns for the excitation laser and efficient collection of the inelastically scattered radiation. By patterning hierarchically defined patterns by controlling the angular spectrum on the collimated illumination, transmissive SERS templates on the tips of optical fiber are possible.

In the present disclosure, all or part of the units or devices of any system and/or apparatus, and/or all or part of functional blocks in any block diagrams and flow charts may be executed by one or more electronic circuitries including a semiconductor device, a semiconductor integrated circuit (IC) (e.g., such as a processor), or a large-scale integration (LSI). The LSI or IC may be integrated into one chip and may be constituted through combination of two or more chips. For example, the functional blocks other than a storage element may be integrated into one chip. The integrated circuitry that is called LSI or IC in the present disclosure is also called differently depending on the degree of integrations, and may be called a system LSI, VLSI (very large-scale integration), or ULSI (ultra large-scale integration). For an identical purpose, it is possible to use an FPGA (field programmable gate array) that is programmed after manufacture of the LSI, or a reconfigurable logic device that allows for reconfiguration of connections inside the LSI or setup of circuitry blocks inside the LSI. Furthermore, part or all of the functions or operations of units, devices or parts or all of devices can be executed by software processing (e.g., coding, algorithms, etc.). In this case, the software is recorded in a non-transitory computer-readable recording medium, such as one or more ROMs, RAMs, optical disks, hard disk drives, solid-state memory, servers, cloud storage, and so on and so forth, having stored thereon executable instructions which can be executed to carry out the desired processing functions and/or circuit operations. For example, when the software is executed by a processor, the software causes the processor and/or a peripheral device to execute a specific function within the software. The system/method/device of the present disclosure may include (i) one or more non-transitory computer-readable recording mediums that store the software, (ii) one or more processors (e.g., for executing the software or for providing other functionality), and (iii) a necessary hardware device (e.g., a hardware interface).

The embodiments were chosen and described in order to best explain the principles of the disclosure and its practical application to thereby enable others skilled in the art to best utilize the disclosure in various embodiments and with various modifications as are suited to the particular use contemplated. Aspects of the disclosed embodiments may be mixed to arrive at further embodiments within the scope of the invention.

It should also be understood that when introducing elements of the present invention in the claims or in the above description of exemplary embodiments of the invention, the terms "comprising," "including," and "having" are intended to be open-ended and mean that there may be additional elements other than the listed elements. Additionally, the term "portion" should be construed as meaning some or all of the item or element that it qualifies, and terms "about" and "substantially" encompass values and/or tolerances within +/− ten percent of expectations, as would be understood by one skilled in the art. Moreover, use of identifiers such as first, second, and third should not be construed in a manner imposing any relative position or time sequence between limitations.

As various modifications could be made in the constructions and methods herein described and illustrated without departing from the scope of the disclosure, it is intended that all matter contained in the foregoing description or shown in the accompanying drawings shall be interpreted as illustrative rather than limiting. Thus, the breadth and scope of the present disclosure should not be limited by any of the above-described exemplary embodiments, but should be defined only in accordance with the following claims appended hereto and their equivalents.

What is claimed is:

1. A method of forming a network array of nanoantennas on an optical fiber, wherein the optical fiber comprises a glass fiber and an encapsulation of the glass fiber, wherein the glass fiber comprises a core and a cladding, the method comprising:
  conducting microsphere photolithography on an optical fiber assembly, wherein the optical fiber assembly comprises:

an exposed area of the glass fiber that is an end surface of the glass fiber and/or a portion of the circumferential surface of the glass fiber from which a portion of the encapsulation has been removed from the optical fiber;
an optional sub-photoresist layer on the exposed area of the glass fiber, wherein the optional sub-photoresist layer has a thickness in a range of about 25 nm to about 150 nm, wherein the sub-photoresist layer comprises a metal, dielectric, semiconductor, or combination thereof;
a photoresist layer secured, directly or indirectly via the optional sub-photoresist layer, to the exposed area of the glass fiber, wherein the photoresist layer comprises a negative photoresist composition or a positive photoresist composition; and
a layer of microspheres, wherein the microspheres are transparent to the photolithographic radiation and have a nominal diameter in a range of about 500 nm to about 3 μm and are in a hexagonal closed packed configuration, and wherein the microspheres in substantially uniform contact with the photoresist layer;
wherein the microsphere photolithography comprises:
directing the photolithographic radiation toward the microsphere layer at an incidence having an polar angle ($\theta$) that is in a range of about $-30°$ to about $30°$ and an azimuthal angle ($\varphi$) that is in a range of $0°$ to $360°$ for an exposure dosage that is in a range of about 0.1 mJ/cm$^2$ to about 25 mJ/cm$^2$ such that the microspheres focus the incident photolithographic radiation to produce an array of photonic jets that expose portions of the photoresist layer, wherein the exposed portions have:
locations that depend, at least in part, on the incidence;
diameters (d) that depend, at least in part, on the exposure dosage, wherein d is in a range of about 50 nm to about 750 nm;
a thicknesses of the photoresist layer; and
a periodicity that depends, at least in part, on the nominal diameter of the microspheres and the incidence, wherein the periodicity is in a range of about 0.5 μm to about 3 μm;
wherein the exposed portions form a repeating pattern of a 2-D shape at the surface of the photoresist layer;
developing the exposed photoresist layer to remove the exposed portions, in the case of a positive photoresist composition, or the unexposed portions, in the case of a negative photoresist composition;
forming the nanoantennas on the portion of the exposed area of the glass fiber, if the optional sub-photoresist layer is not present, or the optional sub-photoresist layer, if present, in a pattern corresponding to the removed portions of the developed photoresist layer, wherein said forming of the nanoantennas is accomplished via etching of the optional sub-photoresist layer, if present, or depositing a nanoantenna material that comprises a comprises a metal, dielectric, semiconductor, or combination; and
removing the remaining photoresist to expose the nanoantennas;
thereby forming the network array of nanoantennas on the optical fiber.

2. The method of claim 1, wherein:
the sub-photoresist layer metal and the nanoantenna material metal are independently selected from the group consisting of aluminum, silver, and gold;
the sub-photoresist layer dielectric and the nanoantenna material dielectric are independently selected from the group consisting GaP, silica, and silicon; and
the sub-photoresist layer semiconductor and the nanoantenna material semiconductor are independently selected from the group consisting of CdS and CdSe.

3. The method of claim 1, wherein the sub-photoresist layer semiconductor and/or the nanoantenna material semiconductor are in the form of quantum dots.

4. The method of claim 1, wherein the microspheres comprise a material selected from the group consisting of $SiO_2$ and polystyrene.

5. The method of claim 1, wherein the source of the photolithographic radiation is fixed and the directing the photographic radiation at the incidence is accomplished by tilting the optical fiber assembly.

6. The method of claim 1, wherein photolithographic radiation is selected from the group consisting of UV and laser light.

7. The method of claim 1, wherein the nanoantennas are holes in the present optional first metal or semiconductor layer having a depth corresponding to that thickness of the optional first metal or semiconductor layer.

8. The method of claim 1, wherein the nanoantennas are columns extending from the exposed area of the glass fiber, if the optional sub-photoresist layer is not present, or the present sub-photoresist layer, and wherein the columns have a height that is in a range of about 25 nm to about 50 nm.

9. The method of claim 1, wherein the nanoantennas are columns extending from the exposed area of the glass fiber, if the optional sub-photoresist layer is not present, or the present sub-photoresist layer, and wherein the columns have a height that is in a range of about 700 nm to about 1.5 μm.

10. The method of claim 1, wherein the step of directing the photolithographic radiation comprises a multiplicity of particular combinations of the polar angle ($\theta$), the azimuthal angle ($\varphi$), and the exposure dosage so that the 2-D shape of the repeating pattern formed by the exposed portions is more complex than a single circle.

11. The method of claim 10, wherein said complex 2-D shape is selected from the group consisting of a multiplicity of spaced circles, split ring resonator, rod, multiple rods, dolmen-like, continuous line, and tripole.

12. The method of claim 1, wherein the microsphere layer is self-assembled on the photoresist layer.

13. The method of claim 1, wherein the microsphere layer is also affixed to a tape and the combination is reusable microsphere mask.

14. The method of claim 1, wherein the optical fiber assembly further comprises a ferrule in which the glass fiber is mounted.

15. The method of claim 1, wherein the optical fiber assembly comprises a multiplicity of the optical fibers such that the exposed areas of the glass fibers are coplanar.

\* \* \* \* \*